(12) United States Patent
Sills et al.

(10) Patent No.: US 11,652,108 B2
(45) Date of Patent: May 16, 2023

(54) INTEGRATED ASSEMBLIES AND METHODS OF FORMING INTEGRATED ASSEMBLIES

(71) Applicant: Micron Technology, Inc., Boise, ID (US)

(72) Inventors: Scott E. Sills, Boise, ID (US); Yi Fang Lee, Boise, ID (US); Kevin J. Torek, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 120 days.

(21) Appl. No.: 17/061,852

(22) Filed: Oct. 2, 2020

(65) Prior Publication Data
US 2022/0109008 A1 Apr. 7, 2022

(51) Int. Cl.
| | | |
|---|---|---|
| *H01L 21/00* | (2006.01) | |
| *H01L 27/00* | (2006.01) | |
| *H01L 29/00* | (2006.01) | |
| *H01L 27/12* | (2006.01) | |
| *H01L 29/786* | (2006.01) | |
| *H01L 21/768* | (2006.01) | |

(52) U.S. Cl.
CPC ........ *H01L 27/1225* (2013.01); *H01L 27/127* (2013.01); *H01L 29/7869* (2013.01); *H01L 21/76877* (2013.01); *H01L 27/1255* (2013.01)

(58) Field of Classification Search
CPC ......... H01L 21/76877; H01L 21/76834; H01L 21/30608; H01L 21/76856; H01L 21/31111; H01L 21/0214; H01L 21/28562; H01L 21/28568; H01L 27/1225; H01L 27/127; H01L 27/1255; H01L 27/10897; H01L 27/10814; H01L 27/1157; H01L 27/11582; H01L 27/11519; H01L 27/10873; H01L 27/10891; H01L 29/7869; H01L 29/78642; H01L 29/0847; H01L 29/7827; H01L 29/40117

See application file for complete search history.

(56) References Cited

U.S. PATENT DOCUMENTS

| | | | | |
|---|---|---|---|---|
| 10,446,566 B2 * | 10/2019 | Parekh | ................ | H01L 29/7883 |
| 11,094,698 B2 * | 8/2021 | Inaba | ................ | H01L 27/10805 |
| 2019/0189629 A1 * | 6/2019 | Parekh | ............. | H01L 27/11524 |
| 2021/0202485 A1 * | 7/2021 | Inaba | ..................... | H01L 28/90 |

* cited by examiner

*Primary Examiner* — Nikolay K Yushin
(74) *Attorney, Agent, or Firm* — Wells St. John P.S.

(57) ABSTRACT

Some embodiments include an integrated assembly which includes a base structure. The base structure includes a series of conductive structures which extend along a first direction. The conductive structures have steps which alternate with recessed regions along the first direction. Pillars of semiconductor material are over the steps. The semiconductor material includes at least one element selected from Group 13 of the periodic table in combination with at least one element selected from Group 16 of the periodic table. The semiconductor material may be semiconductor oxide in some applications. Some embodiments include methods of forming integrated assemblies.

52 Claims, 28 Drawing Sheets

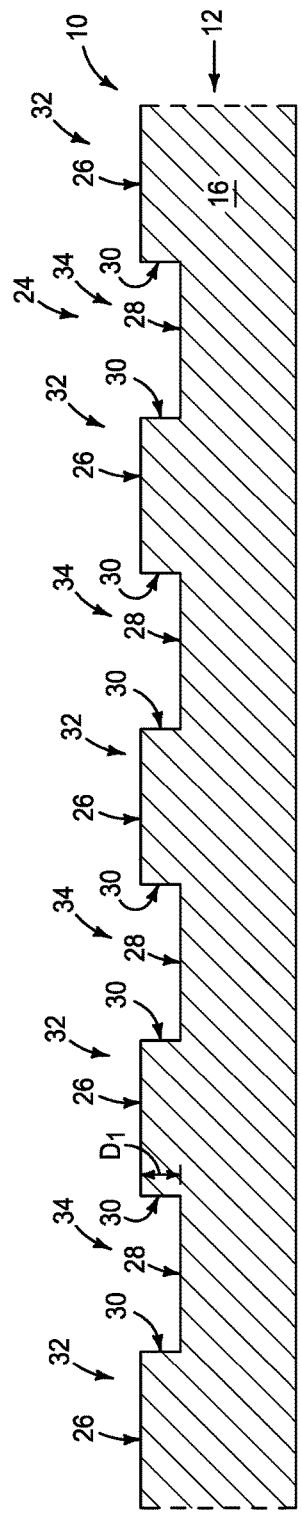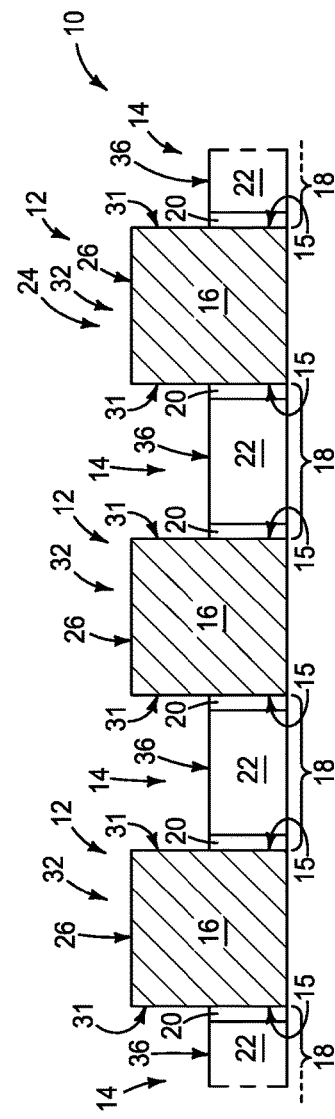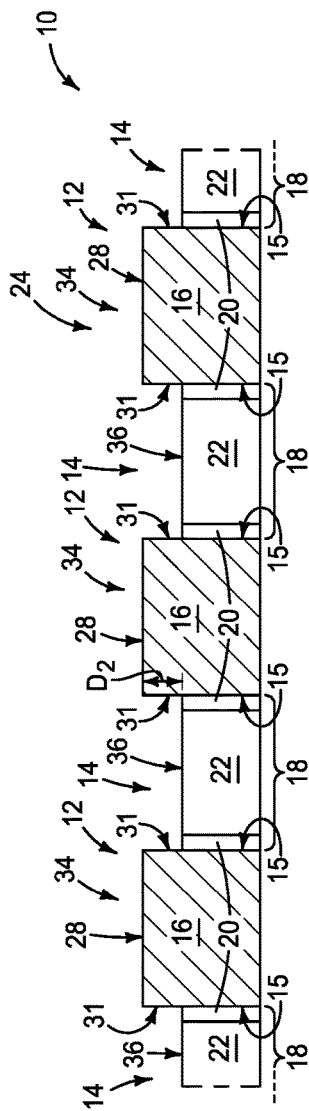

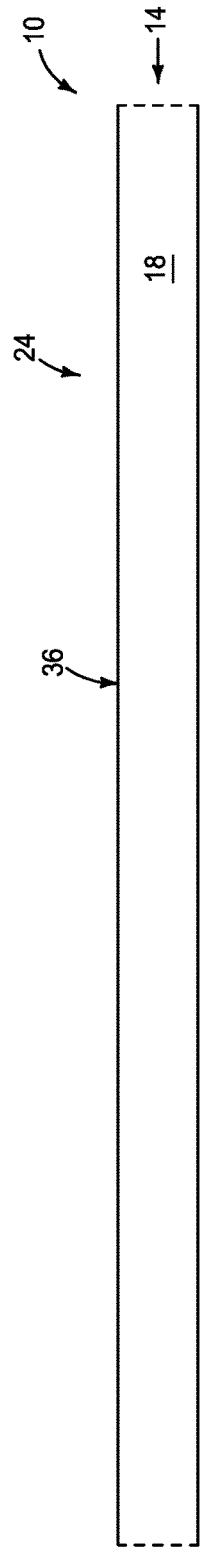
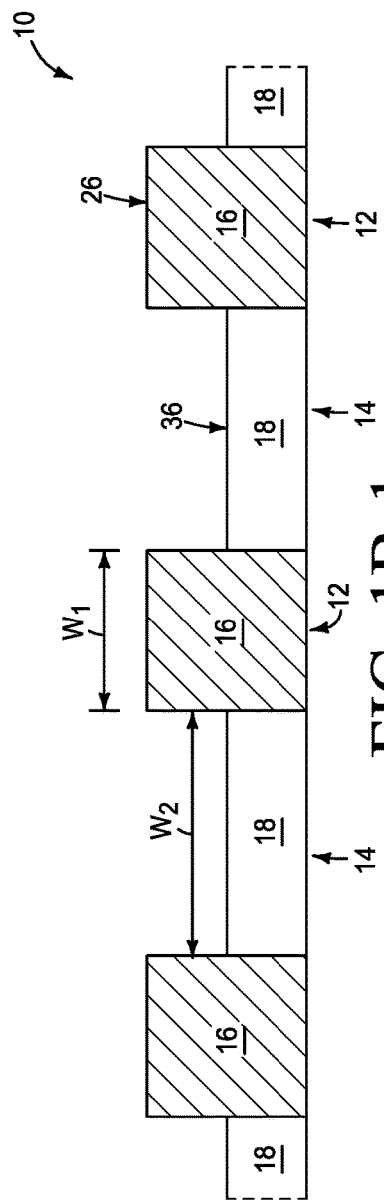
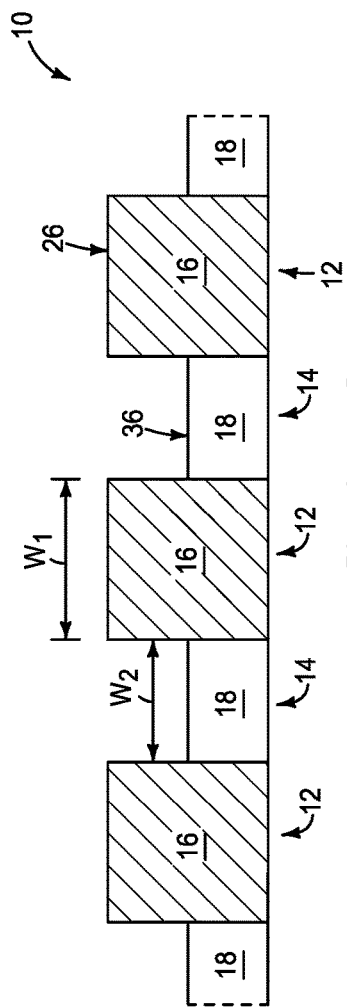

INTEGRATED ASSEMBLIES AND METHODS OF FORMING INTEGRATED ASSEMBLIES

TECHNICAL FIELD

Integrated assemblies (e.g., integrated memory). Methods of forming integrated assemblies.

BACKGROUND

Memory may utilize memory cells which individually comprise an access device (e.g., an access transistor) in combination with a storage element (e.g., a capacitor, a resistive memory device, a phase change memory device, etc.).

It would be desirable to develop improved transistors and improved memory architecture.

BRIEF DESCRIPTION OF THE DRAWINGS

FIGS. 1-1D are diagrammatic views of a region of an example assembly. FIG. 1 is a top-down view. FIGS. 1A-1D are cross-sectional side views along the lines A-A, B-B, C-C and D-D of FIG. 1, respectively.

FIGS. 1B-1 and 1B-2 are diagrammatic cross-sectional side views of regions of example assemblies showing configurations alternative to the configuration of FIG. 1B.

FIGS. 2-2C are diagrammatic views of a region of an example assembly at an example process stage of an example method. FIG. 2 is a top-down view. FIGS. 2A-2C are cross-sectional side views along the lines A-A, B-B and C-C of FIG. 2, respectively.

FIG. 3 is a top-down view. FIGS. 3A-3C are cross-sectional side views along the lines A-A, B-B and C-C of FIG. 3, respectively.

FIG. 4 is a top-down view. FIGS. 4A-4C are cross-sectional side views along the lines A-A, B-B and C-C of FIG. 4, respectively.

FIG. 5 is a top-down view. FIGS. 5A-5C are cross-sectional side views along the lines A-A, B-B and C-C of FIG. 5, respectively.

FIG. 6 is a top-down view. FIGS. 6A-6C are cross-sectional side views along the lines A-A, B-B and C-C of FIG. 6, respectively.

FIG. 7 is a top-down view. FIGS. 7A-7C are cross-sectional side views along the lines A-A, B-B and C-C of FIG. 7, respectively.

FIG. 8 is a top-down view. FIGS. 8A-8C are cross-sectional side views along the lines A-A, B-B and C-C of FIG. 8, respectively.

DETAILED DESCRIPTION OF THE ILLUSTRATED EMBODIMENTS

Some embodiments include integrated assemblies having pillars of semiconductor material (e.g., semiconductor oxide) extending upwardly from conductive steps. The conductive steps may be utilized to generate grain boundaries during deposition of the semiconductor material, and such grain boundaries may be beneficial during patterning of the pillars from the deposited semiconductor material. Example embodiments are described with reference to FIGS. 1-15. Initially, an example method of fabricating and using pillars of semiconductor material is described with reference to FIGS. 1-8.

Figure 1:
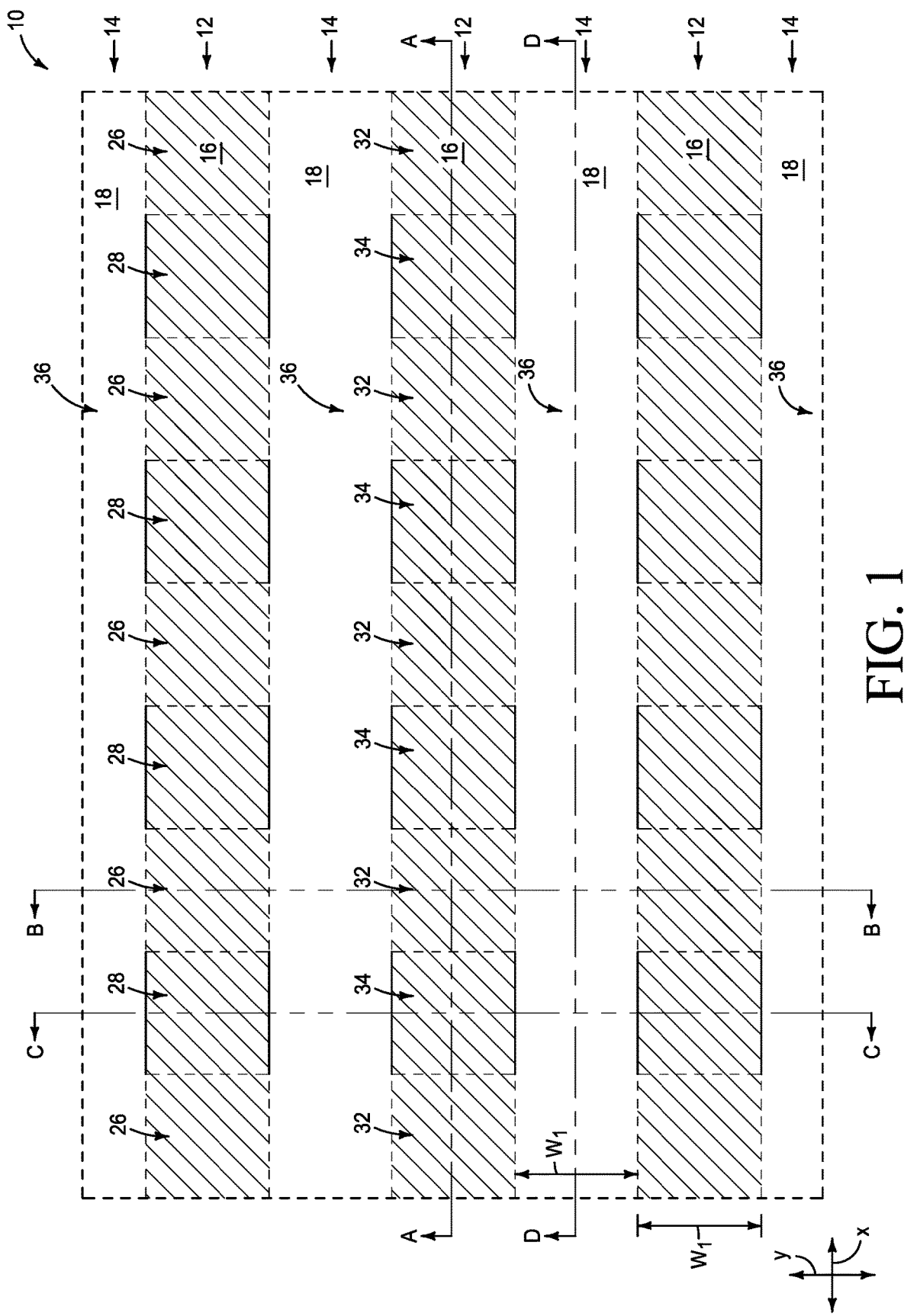

Referring to FIGS. 1-1D, a template structure (base structure) 10 includes alternating conductive structures 12 and insulative structures 14. The structures 12 and 14 extend along a first direction corresponding to an illustrated x-axis direction, and alternate with one another along a second direction corresponding to an illustrated y-axis direction. The x-axis direction (first direction) is shown to be orthogonal to the y-axis direction (second direction). In some embodiments, the first and second directions may be considered to be substantially orthogonal to one another, with the term "substantially orthogonal" meaning orthogonal to within reasonable tolerances of fabrication.

The conductive structures 12 comprise conductive material 16. The conductive material 16 may comprise any suitable composition(s), and in some embodiments may comprise, consist essentially of, or consist of one or more metals. For instance, the conductive material 16 may comprise, consist essentially of, or consist of one or more of tungsten (W), ruthenium (Ru) and molybdenum (Mo).

The insulative structures comprise insulative material 18. The insulative material 18 may comprise any suitable composition(s). For instance, in some embodiments the insulative material 18 may comprise, consist essentially of, or consist of one or both of silicon dioxide and silicon nitride. FIGS. 1B and 1C diagrammatically illustrate an example configuration in which the insulative material 18 comprises silicon nitride 20 as liners along the metal-containing material 16 of the conductive structures 12, and comprises silicon dioxide fill material 22 between the liners. The configuration of the material 18 of FIGS. 1B and 1C is an optional configuration, and is only shown in FIGS. 1B and 1C in order to simplify the drawings.

The conductive structures 12 have upper surfaces 26 and lower surfaces 28. In some embodiments, the surfaces 26 and 28 may be referred to as first and second surfaces, respectively, which are vertically offset relative to one another. The conductive structures 12 have transition regions 30 between the first and second surfaces 26 and 28. The surfaces 26 and 28 are shown to be horizontally-extending surfaces. In some embodiments, the surfaces 26 and 28 may be referred to as being substantially horizontal, with the term substantially horizontal meaning horizontal to within reasonable tolerances of fabrication and measurement.

In some embodiments, the surfaces 26 and transition regions 30 may be considered together to be configured as steps 32, and the surfaces 28 may be considered to be along recessed regions 34 between the steps. The steps 32 and recessed regions 34 alternate with one another along the x-axis direction.

The surfaces 26 are offset from the surfaces 28 by a distance $D_1$. The distance $D_1$ may be any suitable amount, and in some embodiments may be at least about 2 nanometers (nm), at least about 5 nm, within a range of from about 5 nm to about 10 nm, etc.

The insulative structures 14 have upper surfaces 36. In the illustrated embodiment, the upper surfaces 36 of the structures 14 are lower than the upper surfaces 28 of the recessed regions 34, as shown in FIG. 1C. The upper surfaces 36 of the structures 14 are vertically offset from the upper surfaces 28 of the recessed regions 34 by a distance $D_2$. The distance $D_2$ may be any suitable amount, and in some embodiments may be at least about 2 nm, at least about 5 nm, within a range of from about 5 nm to about 10 nm, etc. In some embodiments, the template structure 10 may be considered to comprise additional transition regions 31 between the surfaces 36 of the insulative structures 14, and the surfaces 26 and 28 of the conductive structures 14.

In some embodiments, each of the conductive structures 12 may be considered to have a pair of opposing sidewalls 15 (shown in FIGS. 1B and 1C). The insulative material 18 of the structures 14 is along and directly against the sidewalls 15.

In some embodiments, the template structure 10 may be considered to have an undulating topography 24 which includes the surfaces 26 and 28 of the conductive structures 12, and the surfaces 36 of the insulative structures 14. The surfaces 26 may be considered to be first surfaces, and the surfaces 28 and 36 may be considered to be second surfaces which are vertically offset relative to the first surfaces. In some embodiments, the surfaces 28 of the conductive structures 12 may be considered to be a first set of the second surfaces, and the surfaces 36 of the insulative structures 14 may be considered to be a second set of the second surfaces.

Figure 1E:
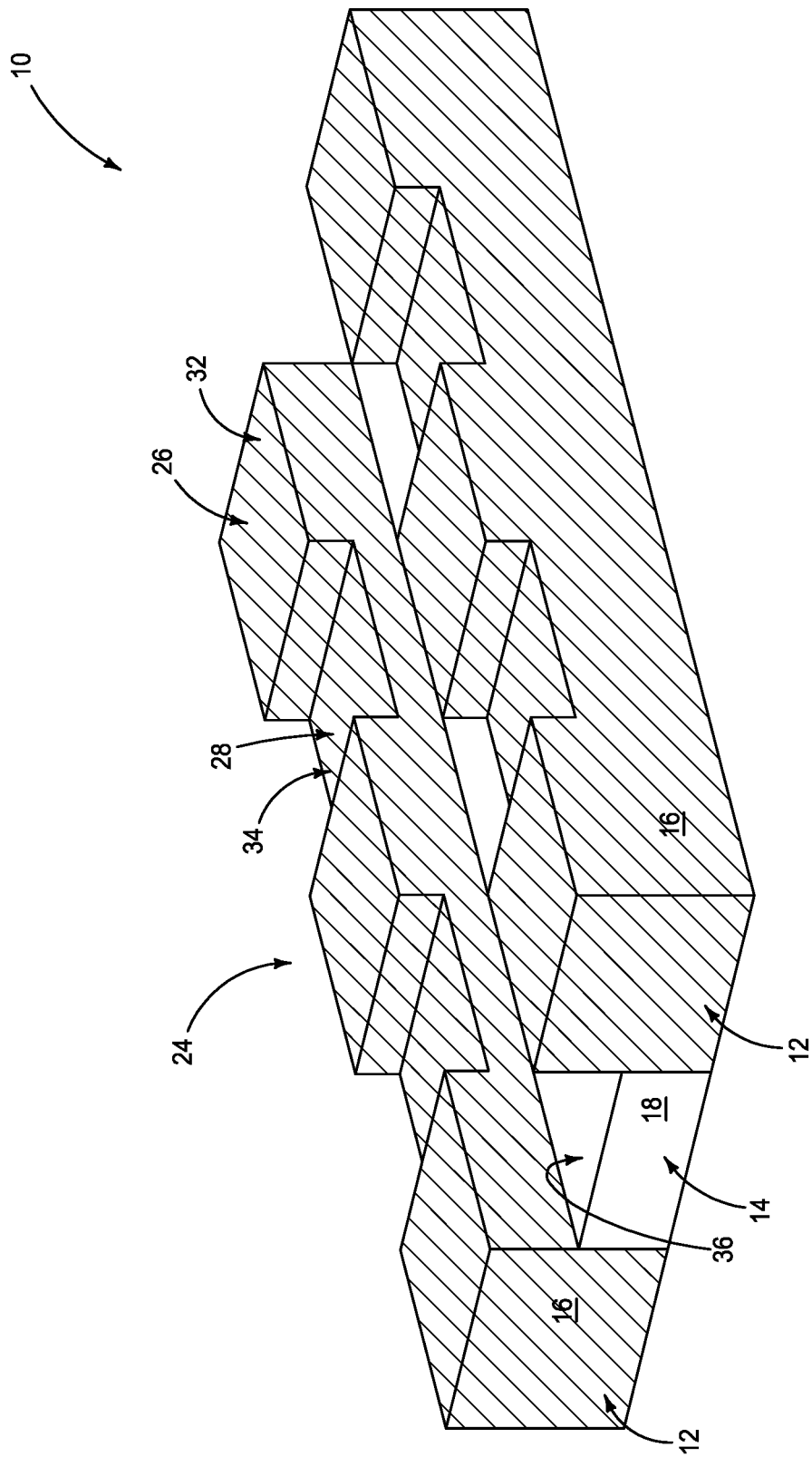
FIG. 1E is a diagrammatic three-dimensional view of a region of the example assembly of FIGS. 1-1D.

FIG. 1E shows a three-dimensional view of a region of the template structure 10 to assist the reader in understanding an example configuration of such structure.

Figure 2:
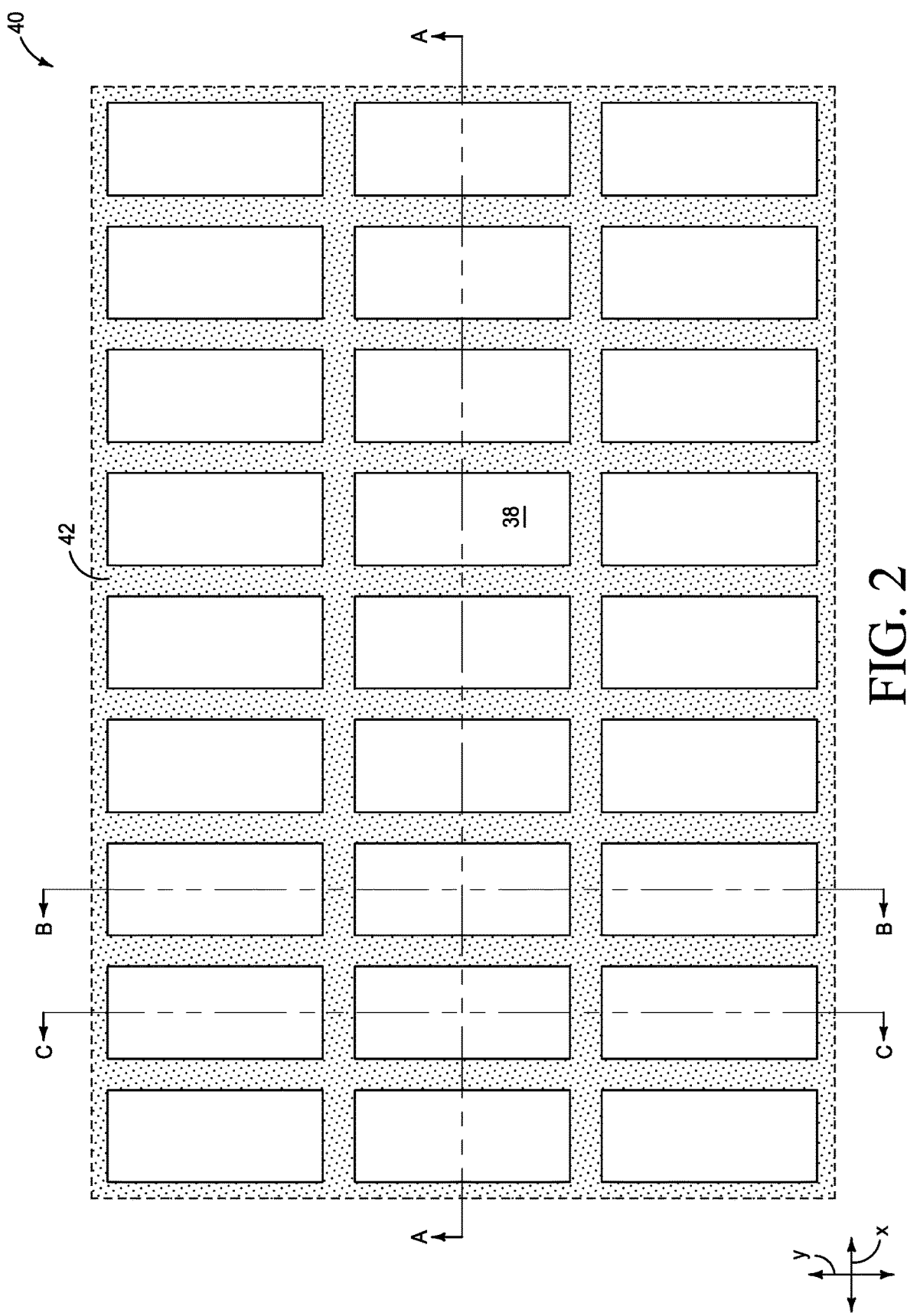
Figure 2A:
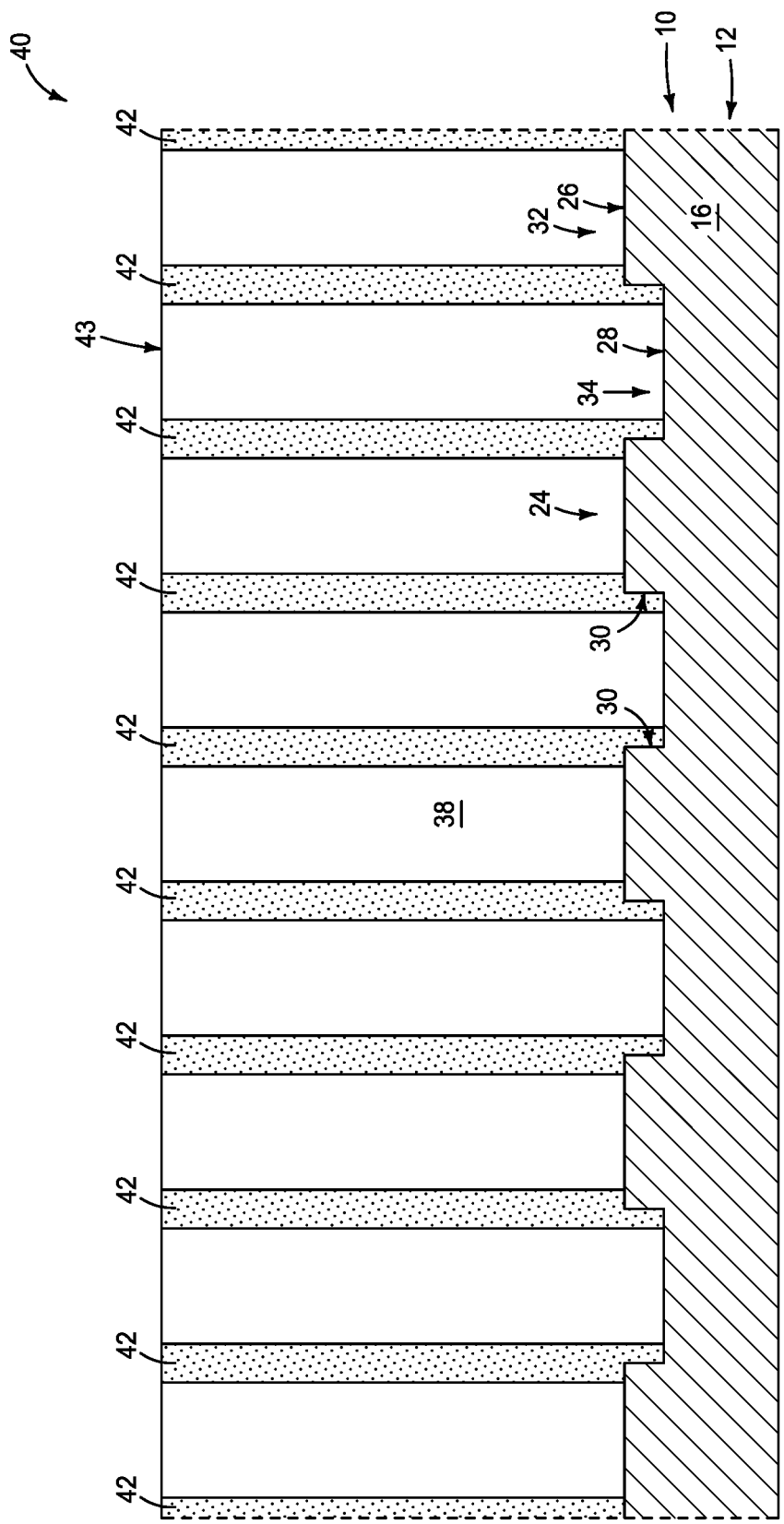
Figure 2B:
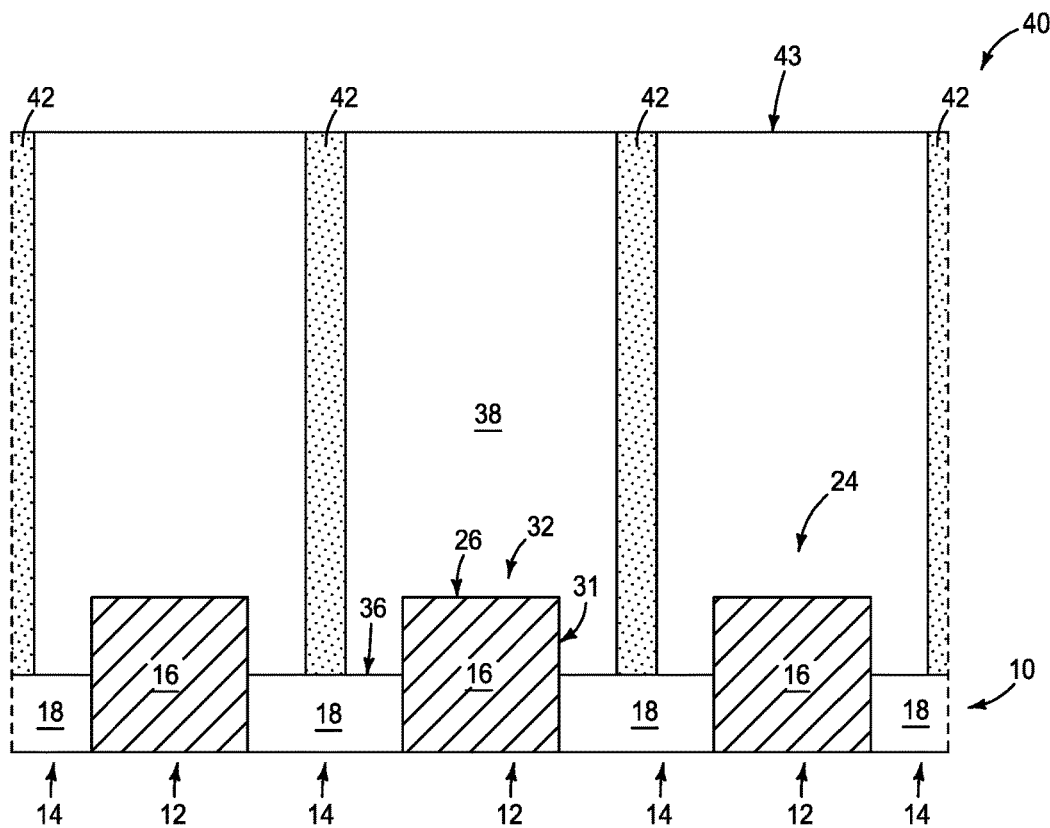

The embodiment of FIGS. 1-1E shows the insulative structures 14 having a same width $W_1$ as the conductive structures 16 along the y-axis direction (second direction), with such width being labeled in FIG. 1. In other embodiments, the insulative structures 14 may have different widths relative to the conductive structures 12. For instance, FIGS. 1B-1 and 1B-2 show cross-sections analogous to the cross-section of FIG. 1B in example embodiments in which the insulative structures 14 have widths $W_2$ which are different than the widths $W_1$ of the conductive structures 12. Specifically, FIG. 1B-1 shows a configuration in which the insulative structures 14 have widths $W_2$ greater than the widths $W_1$ of the conductive structures 12, and FIG. 1B-2 shows a configuration in which the insulative structures 14 have widths $W_2$ less than the widths $W_1$ of the conductive structures 12.

Figure 15:
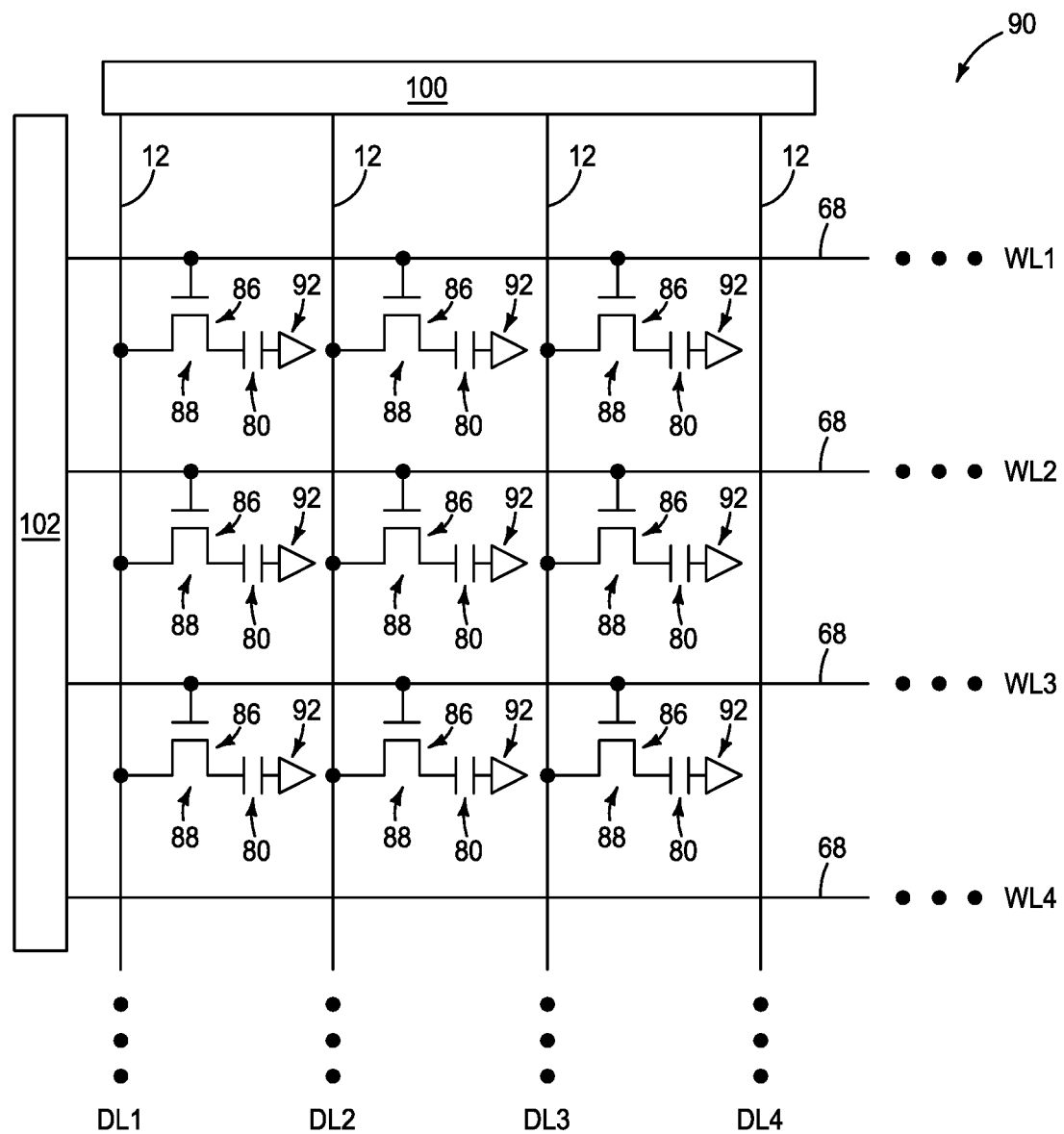
FIG. 15 is a diagrammatic schematic view of a region of an example memory array.

In some embodiments, the conductive structures 12 may correspond to digit lines, and may be coupled with sensing circuitry (sense amplifier circuitry) which is described below with reference to FIG. 15.

The base structure 10 may be supported by a semiconductor substrate (not shown). The semiconductor substrate may comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

Figure 2C:
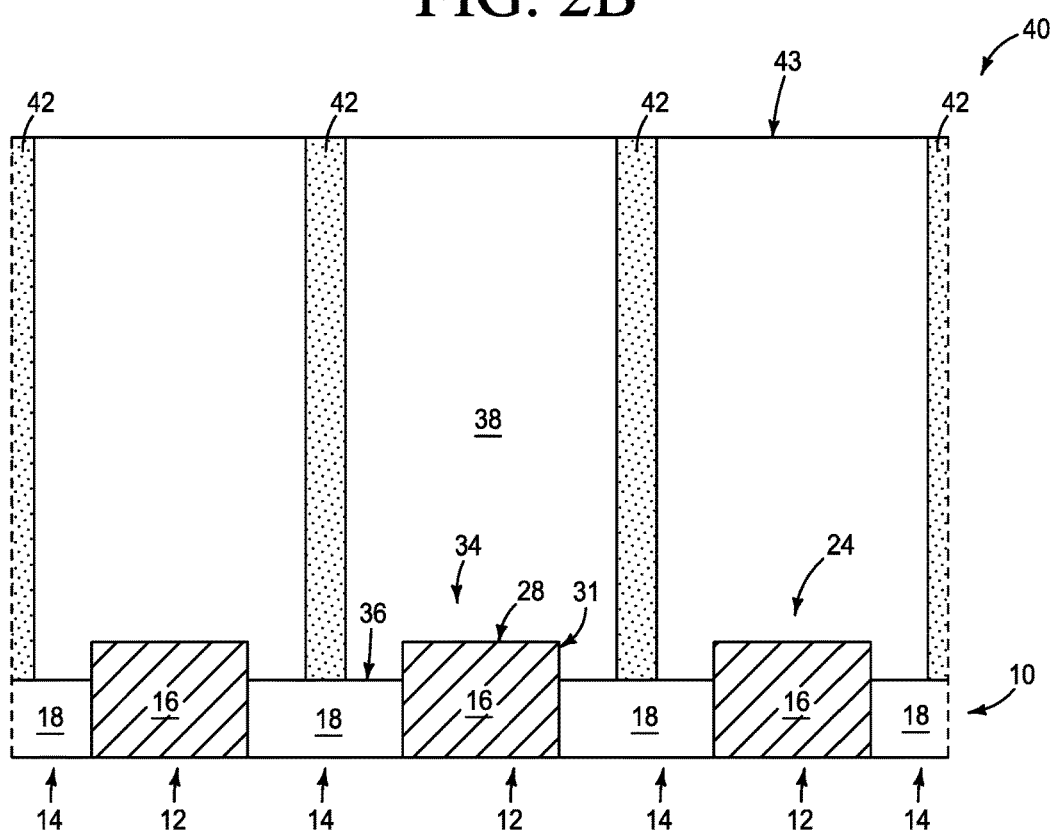

Referring to FIGS. 2-2C, semiconductor material 38 is deposited over the template structure (base structure) 10, and in the shown embodiment directly contacts the conductive material 16 of the steps 32. The semiconductor material 38 and base structure 10 together form an assembly 40.

The semiconductor material 38 may be deposited with any suitable methodology, including, for example, one or more of physical vapor deposition (PVD), chemical vapor deposition (CVD) and atomic layer deposition (ALD).

Grain boundary regions 42 (diagrammatically illustrated with stippling) are generated, at least in part, by the transition regions 30 and 31 during the deposition of the semiconductor material 38, and comprise regions where different grain orientations interface with one another (i.e., comprise grain boundaries). The grain boundary regions result from the deposited semiconductor material establishing grain growth along directions normal to surfaces of the topography 24 of the template structure 10. Specifically, the vertically-extending transition regions 30 and 31 between the horizontally-extending surfaces 26, 28 and 36 may propagate grain boundaries, and may lead to the illustrated grain boundary regions 42. The grain boundary regions 42 are shown to extend as vertically-straight regions. It is to be understood that in other embodiments the grain boundary regions may have other configurations. For instance, the grain boundaries may have tapered or curved configurations (which may extend from the transition regions 30 and/or 31 or from regions proximate the transition regions 30 and/or 31), rather than having the illustrated vertically-straight configurations. The regions of the semiconductor material 38 between the grain boundary regions are shown to be rectangular columns. In other embodiments, the grain boundary regions 42 may be curved (e.g., substantially parabolic), and the regions of the semiconductor material 38 between the grain boundary regions 42 may be pillow-shaped, cloud-shaped, etc. The particular orientation and configuration of the grain boundary regions 42 may be tailored by modifying the size, shape, etc., of the transition regions 30 and 31 relative to the size, shape, etc., of the surfaces 26, 28 and 36.

In the shown embodiment, a planarized surface 43 is formed across the material 38 after the deposition of such material.

The semiconductor material 38 may comprise any suitable composition(s); and in some embodiments may comprise, consist essentially of, or consist of at least one metal (e.g., one or more of aluminum, gallium, indium, thallium, tin, cadmium, zinc, etc.) in combination with one or more of oxygen, sulfur, selenium and tellurium. In some embodiments, the semiconductor material 38 may comprise at least one element from Group 13 of the periodic table (e.g., gallium) in combination with at least one element from Group 16 of the periodic table (e.g., oxygen). For instance, the semiconductor material 38 may comprise at least one element selected from the group consisting of gallium, indium and mixtures thereof, in combination with at least one element selected from the group consisting of oxygen, sulfur, selenium, tellurium and mixtures thereof. In some embodiments, the semiconductor material 38 may comprise, consist essentially of, or consist of a semiconductor oxide (i.e., a semiconductor material comprising oxygen). For instance, in some embodiments the semiconductor material 38 may comprise, consist essentially of, or consist of InGaZnO (where the chemical formula indicates primary constituents rather than a specific stoichiometry).

The semiconductor material 38 may be homogeneous or may comprise two or more different compositions. In some embodiments, a lower region of the semiconductor material 38 may be configured as a lower source/drain region, an upper region of the semiconductor material 38 may be configured as an upper source/drain region, and a central region of the second material 38 (i.e., a region between the upper and lower source/drain regions) may be configured as a channel region. The source/drain regions may comprise different compositions than the channel region and/or comprise different dopant(s) than the channel region. Example source/drain regions and channel regions are described below with reference to FIGS. 8-8C.

Figure 3:
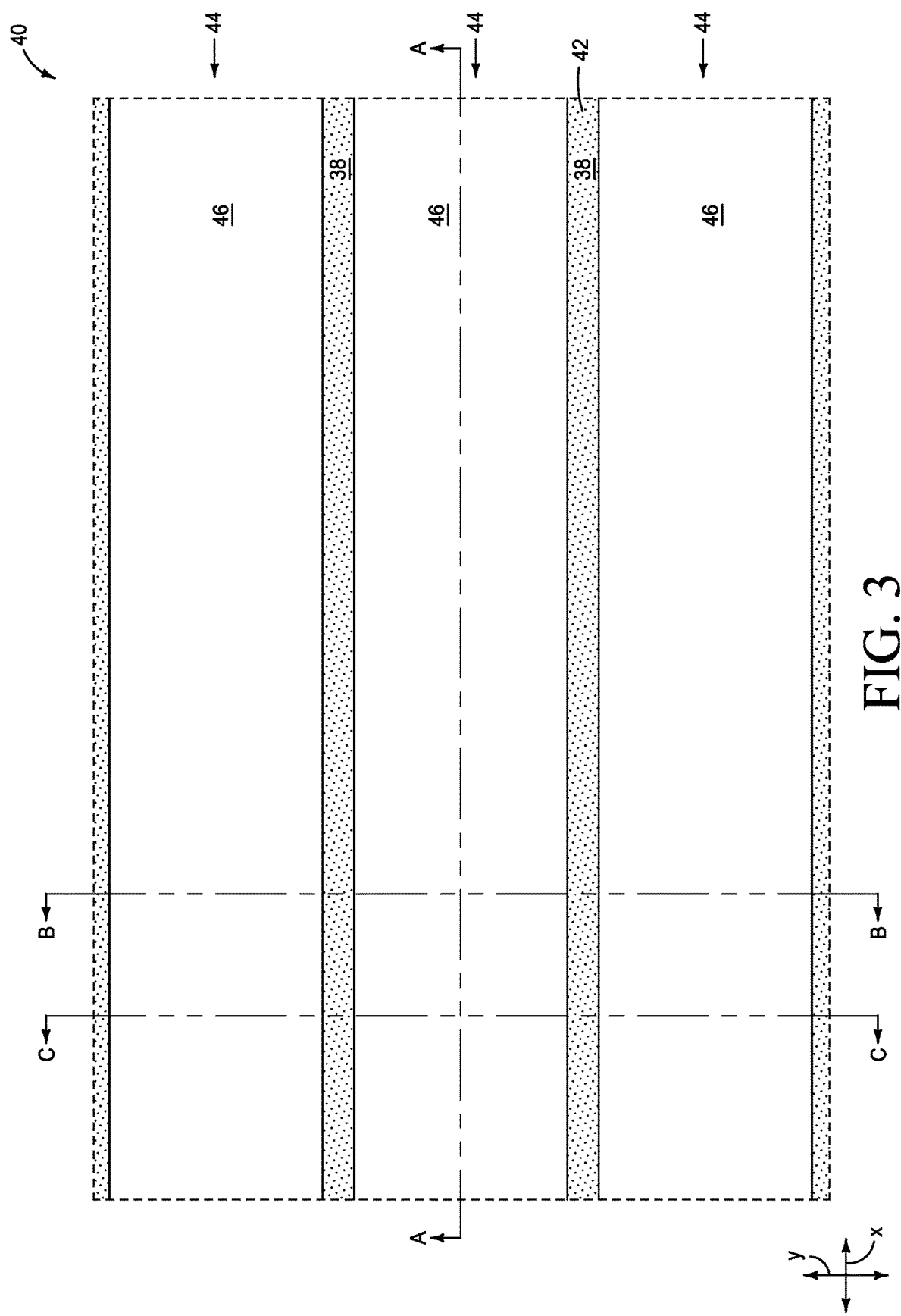
FIGS. 3-3C are diagrammatic views of a region of the example assembly of FIGS. 2-2C at an example process stage subsequent to that of FIGS. 2-2C.
Figure 3A:
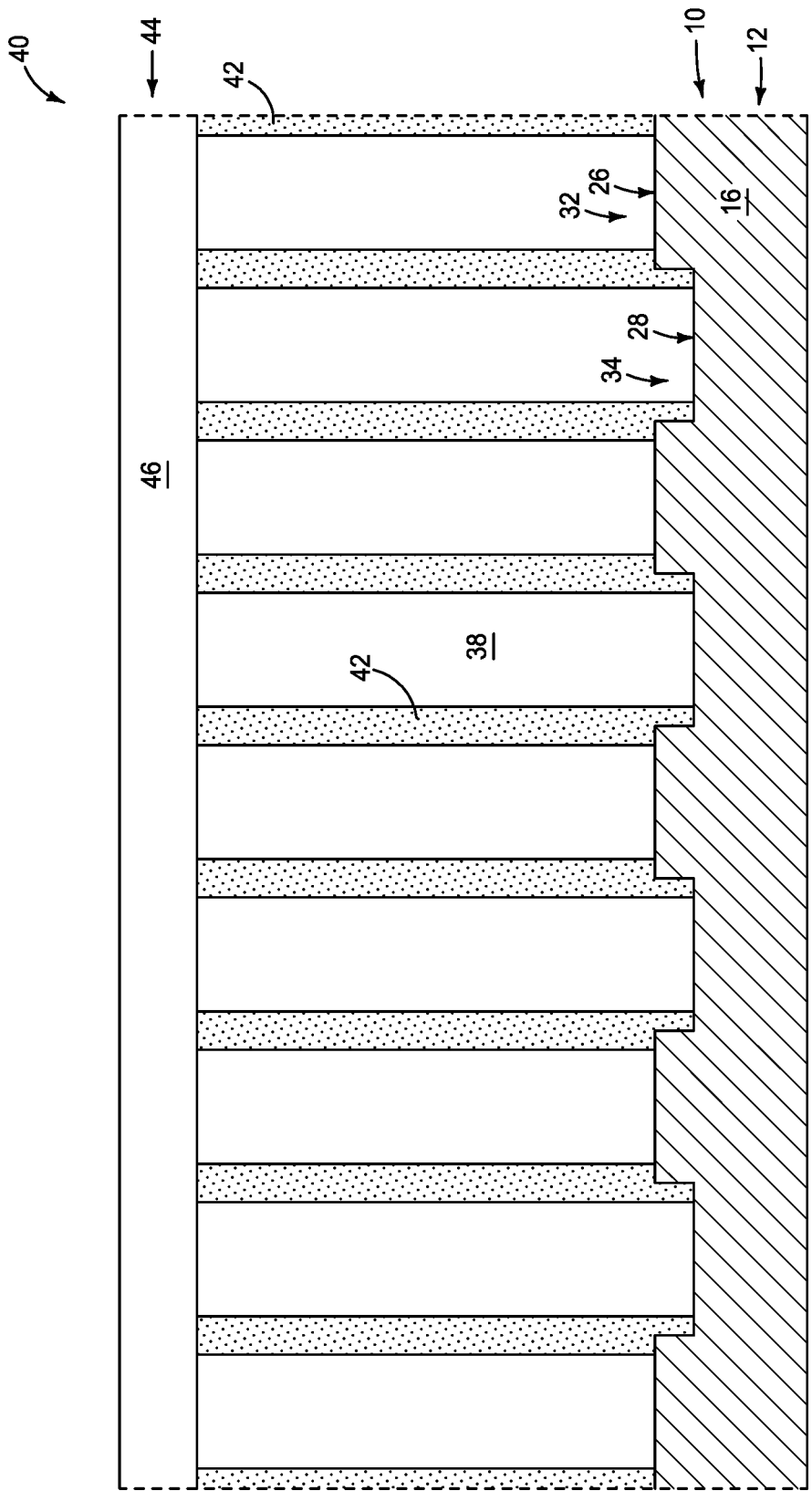
Figure 3B:
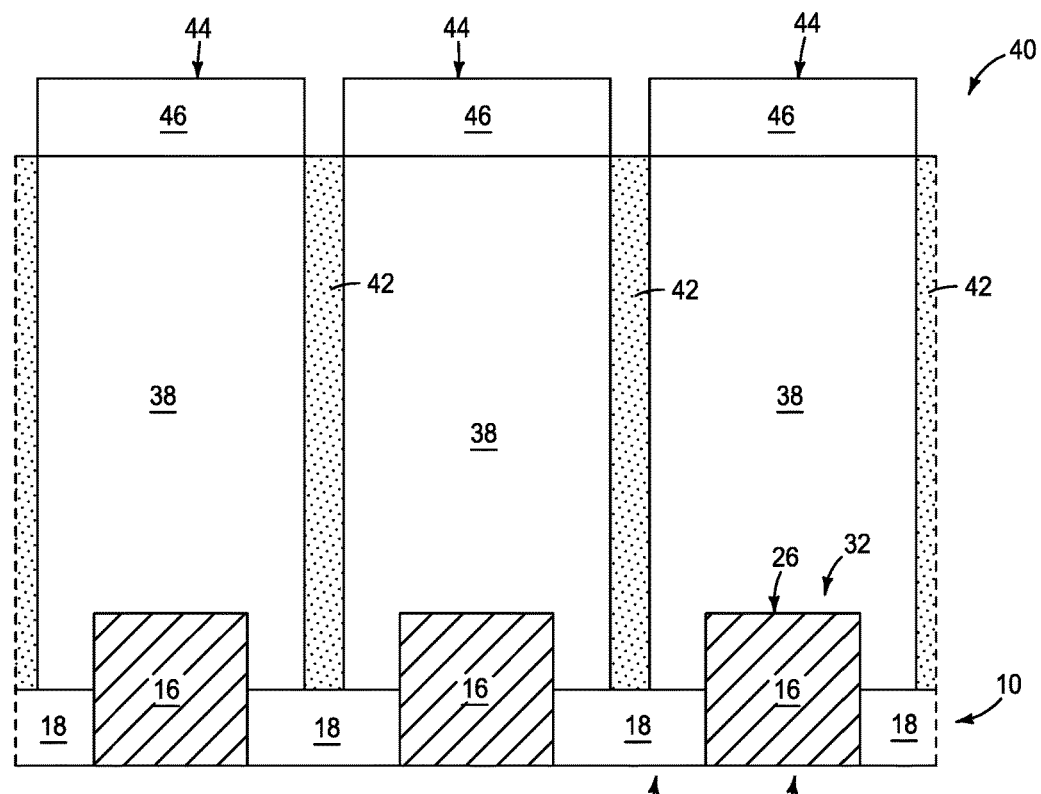
Figure 3C:
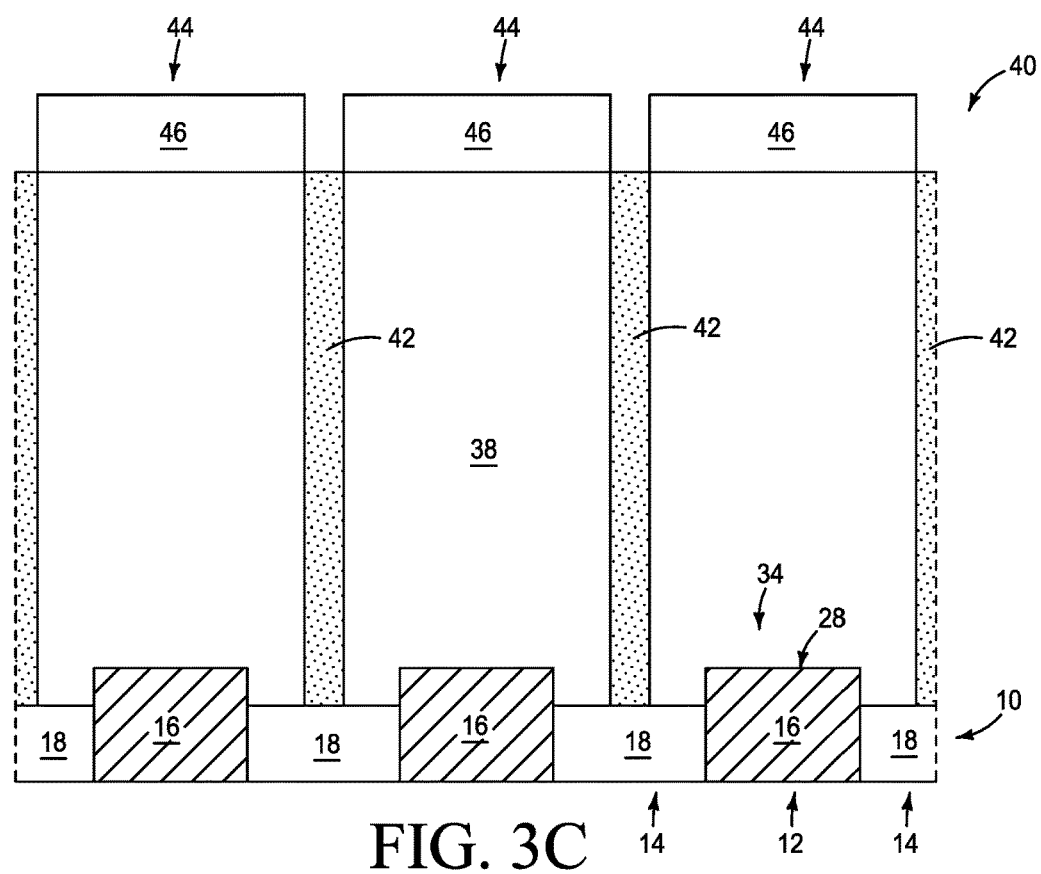

Referring to FIGS. 3-3C, masking structures 44 are formed over the semiconductor material 38. The masking structures 44 comprise masking material 46. The masking material 46 may comprise any suitable composition(s), and in some embodiments may comprise photolithographically-patterned photoresist.

The masking structures 44 are illustrated to be linear structures which extend along the first direction (the x-axis direction). The linear structures may be straight (as shown), or may be curved, wavy, etc. In some embodiments, the masking structures 44 may be considered to be first masking structures configured as first linear structures.

Figure 4:
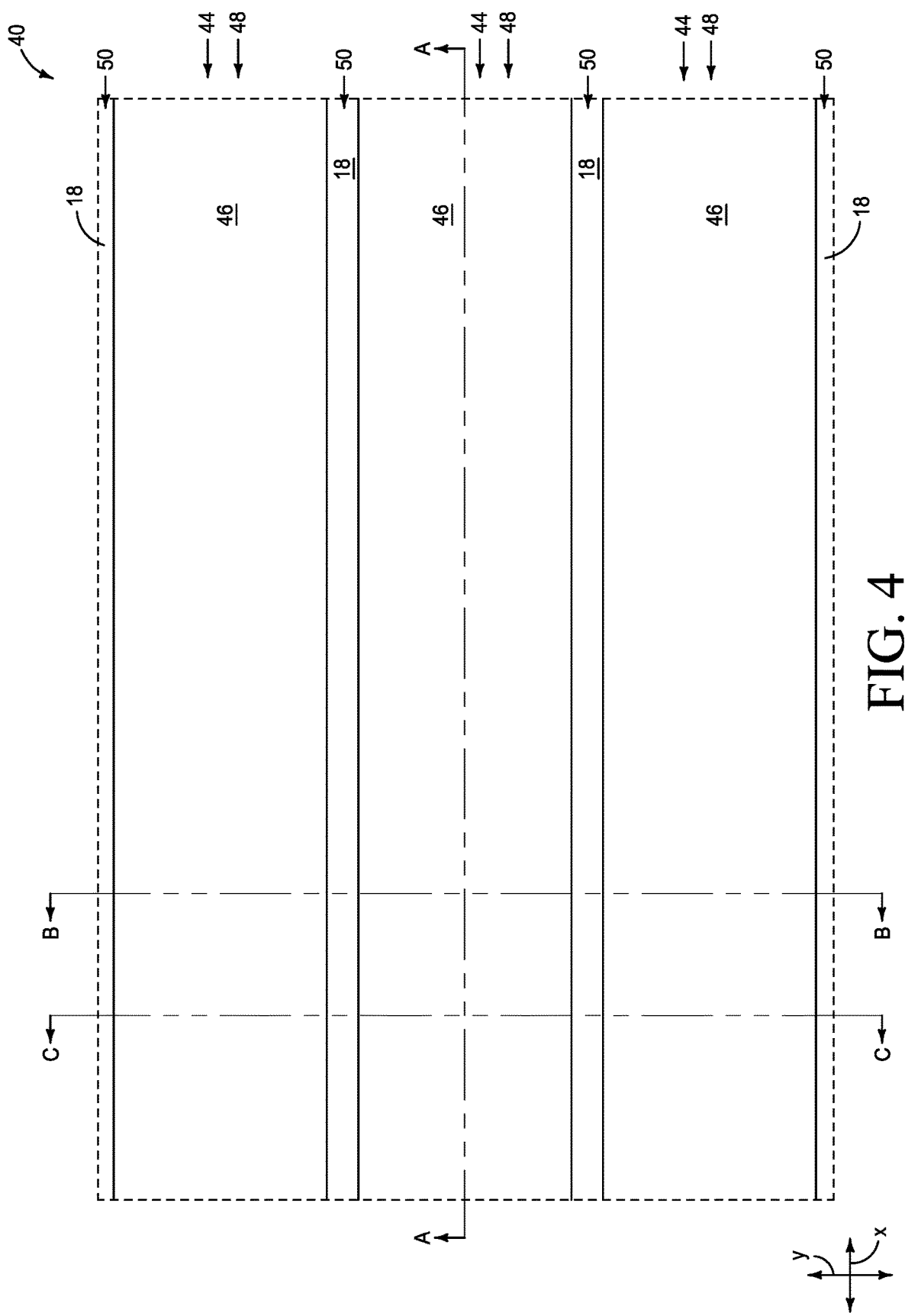
FIGS. 4-4C are diagrammatic views of a region of the example assembly of FIGS. 2-2C at an example process stage subsequent to that of FIGS. 3-3C.
Figure 4A:
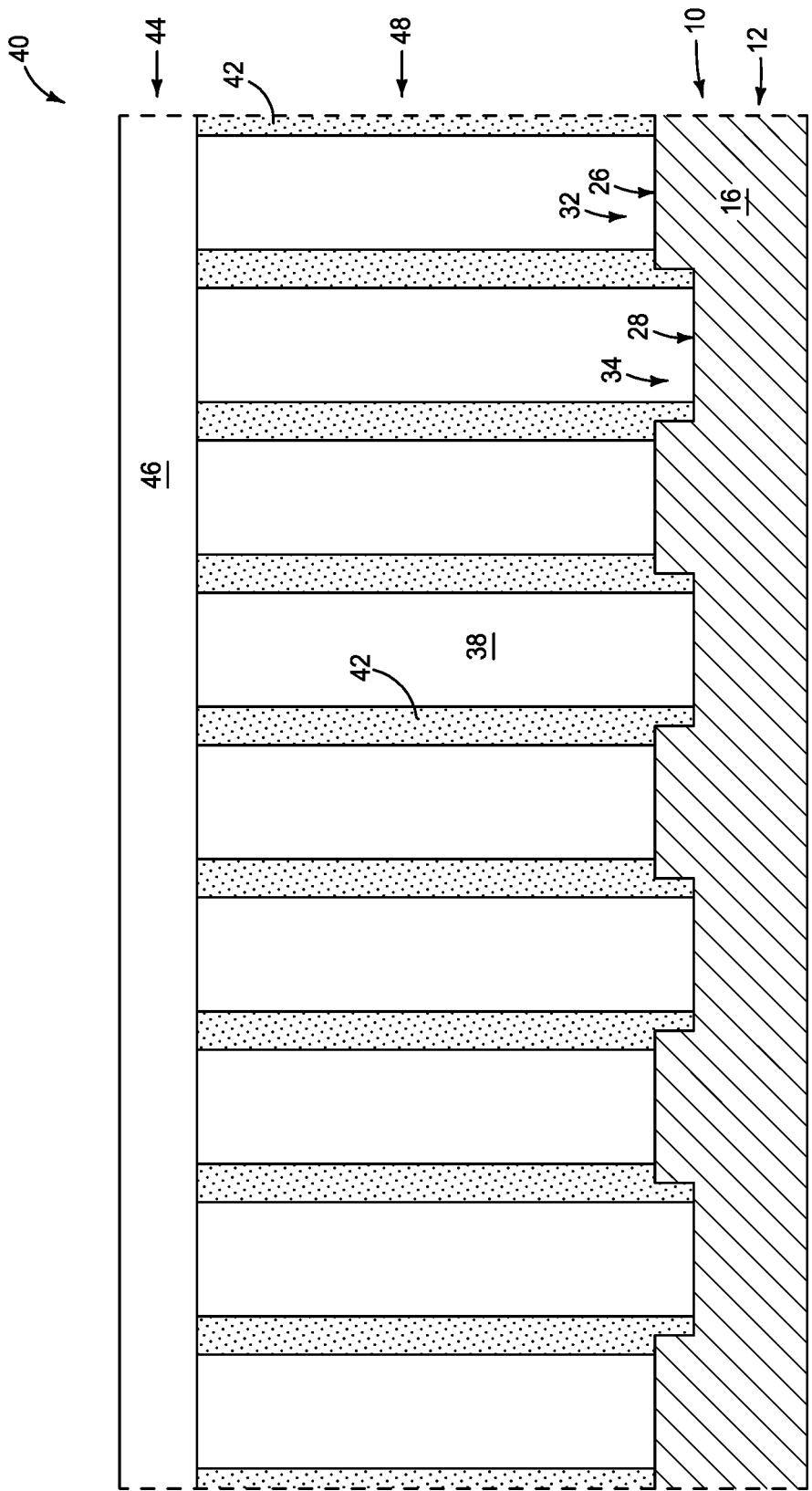
Figure 4B:
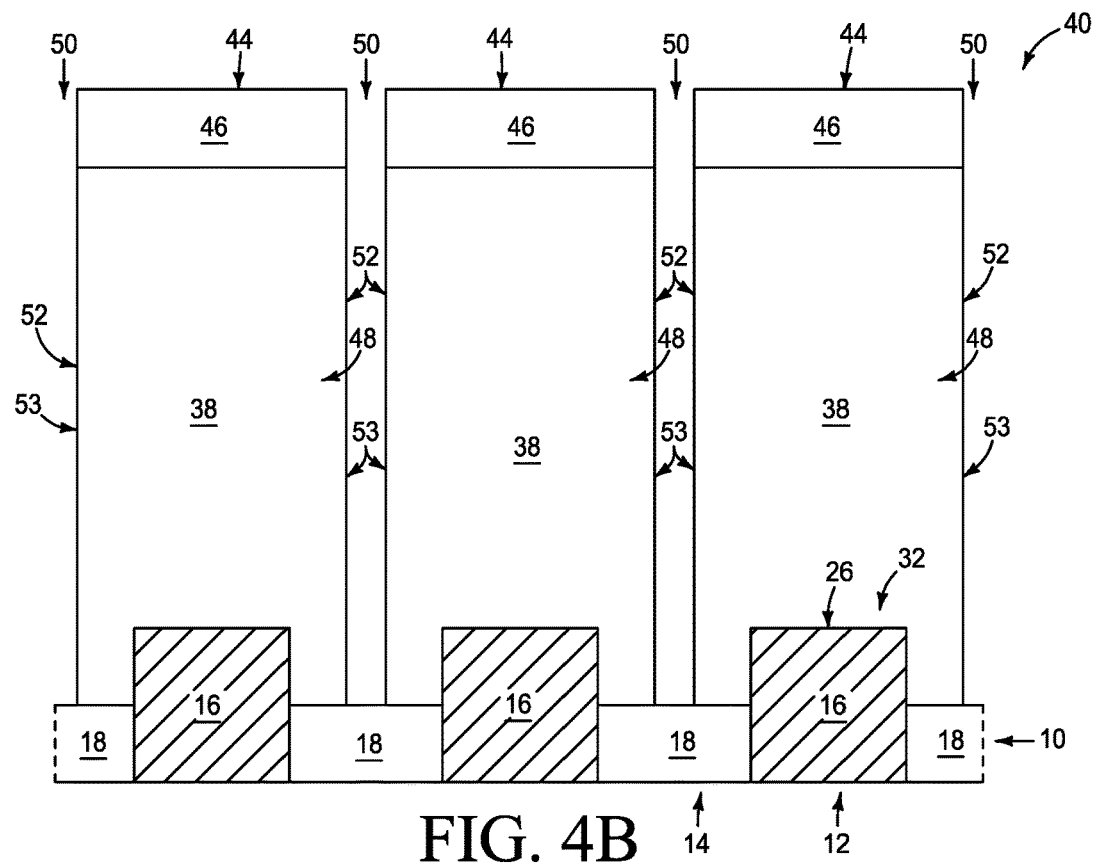
Figure 4C:
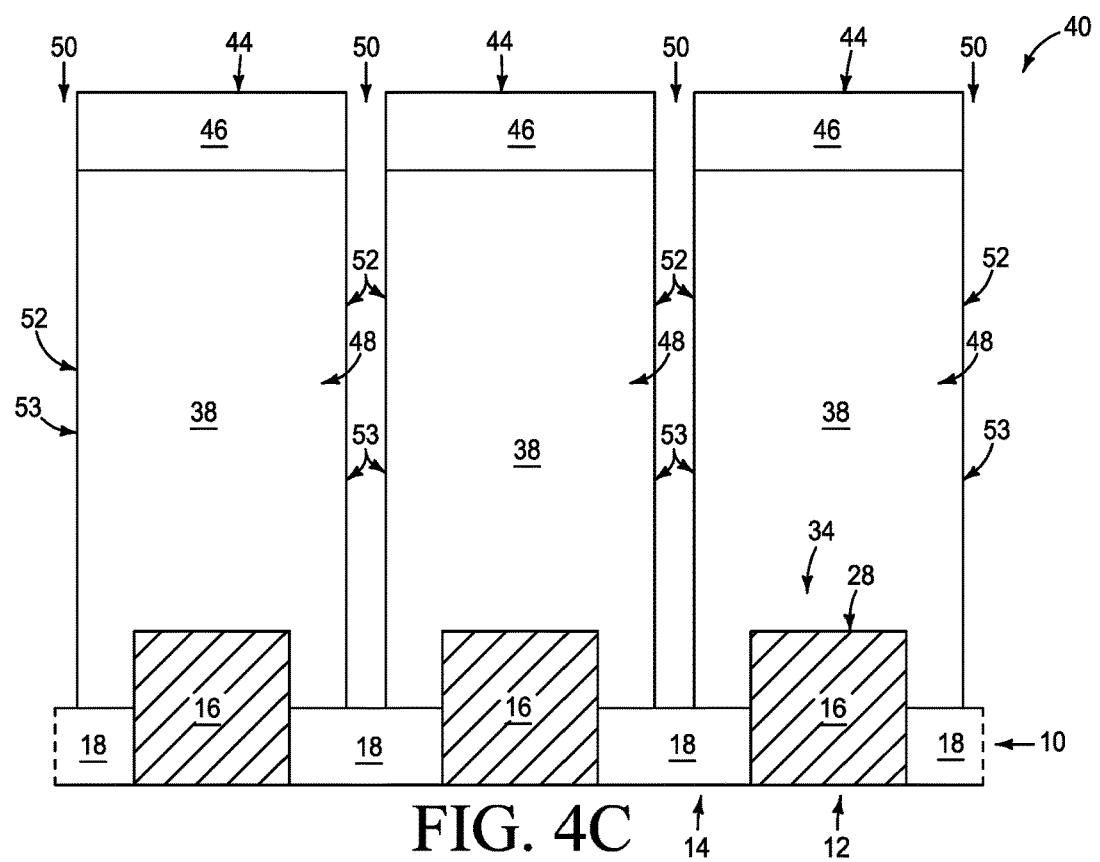

Referring to FIGS. 4-4C, a pattern is transferred from the masking structures 44 into the semiconductor material 38. The pattern may be transferred into the semiconductor material 38 with any suitable etch or combination of etches. In some embodiments, dry etching may be utilized, with an example dry etch being a reactive ion etch (RIE). The reactive ion etch may or may not utilize a plasma. The etching forms gaps 50 which extend through the semiconductor material 38 to the underlying insulative material 18, and patterns the semiconductor material 38 into linear features 48. The linear features 48 extend along the first direction (the illustrated x-axis direction). The linear features 48 are over the conductive structures 12, and are in one-to-one correspondence with the conductive structures 12.

Although the linear features 48 are shown to be substantially straight along the x-axis direction, it is to be understood that in other embodiments the linear features may be curved, wavy, etc.

The grain boundary regions 42 (FIGS. 3-3C) may advantageously improve the etch. For instance, the etch may initially follow the grain boundaries as such grain boundaries may correspond to "soft" regions of the semiconductor 38. Thus, the grain boundaries may assist in the vertical alignment of the etch, and may help to achieve highly anisotropic results from the etch. The highly-anisotropic etch may lead to desired vertical sidewalls 52 of the linear features 48. In some embodiments, the steps 32 may be considered to have substantially horizontal upper surfaces 26, and the sidewalls 52 may be considered to have substantially vertical surfaces 53. The sidewall surfaces 53 may be within about 15° of orthogonal to the substantially horizontal upper surfaces 26, and in some embodiments may be substantially orthogonal to the substantially horizontal upper surfaces (with the term "substantially orthogonal" meaning orthogonal to within reasonable tolerances of fabrication and measurement).

Figure 5:
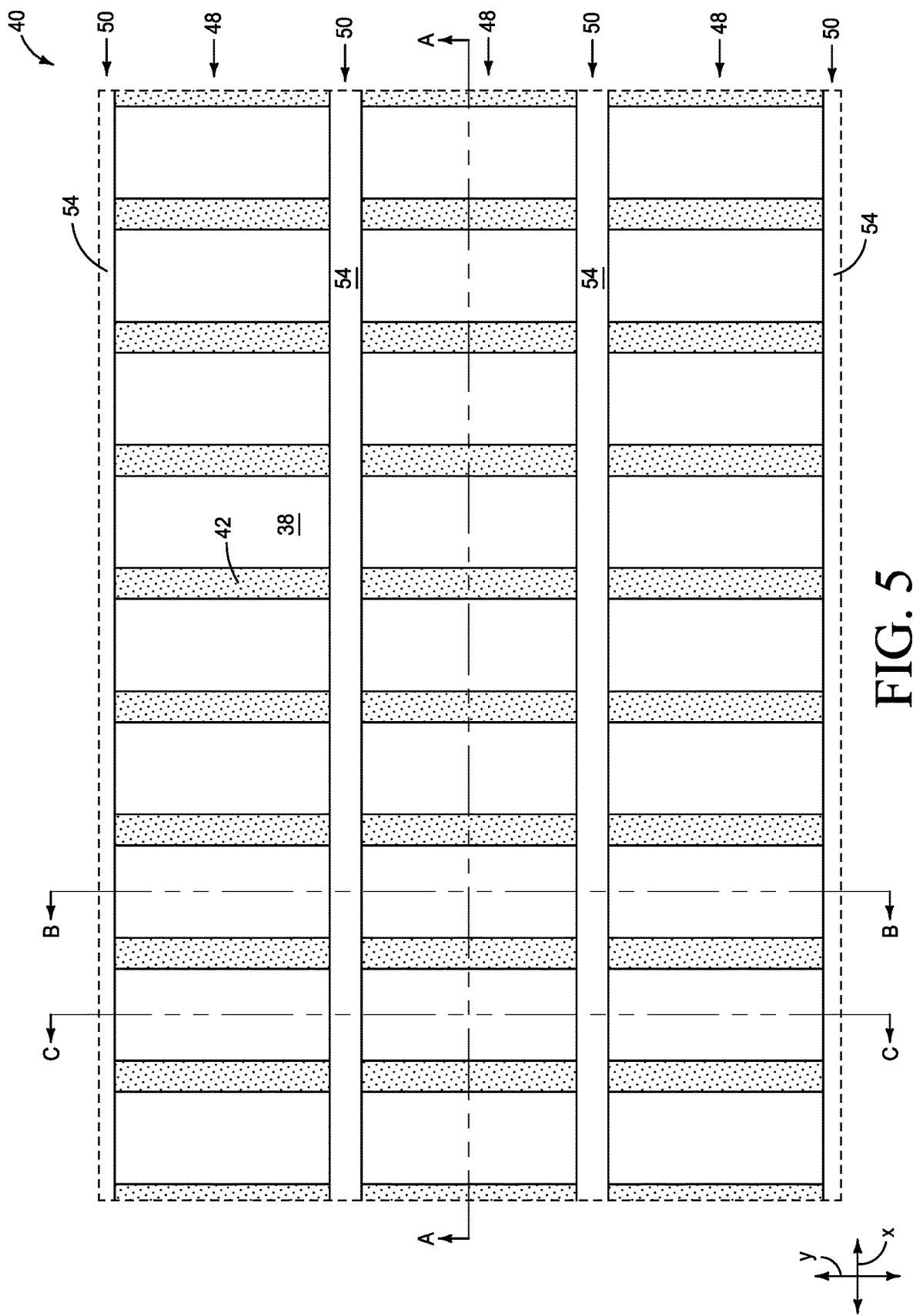
FIGS. 5-5C are diagrammatic views of a region of the example assembly of FIGS. 2-2C at an example process stage subsequent to that of FIGS. 4-4C.
Figure 5A:
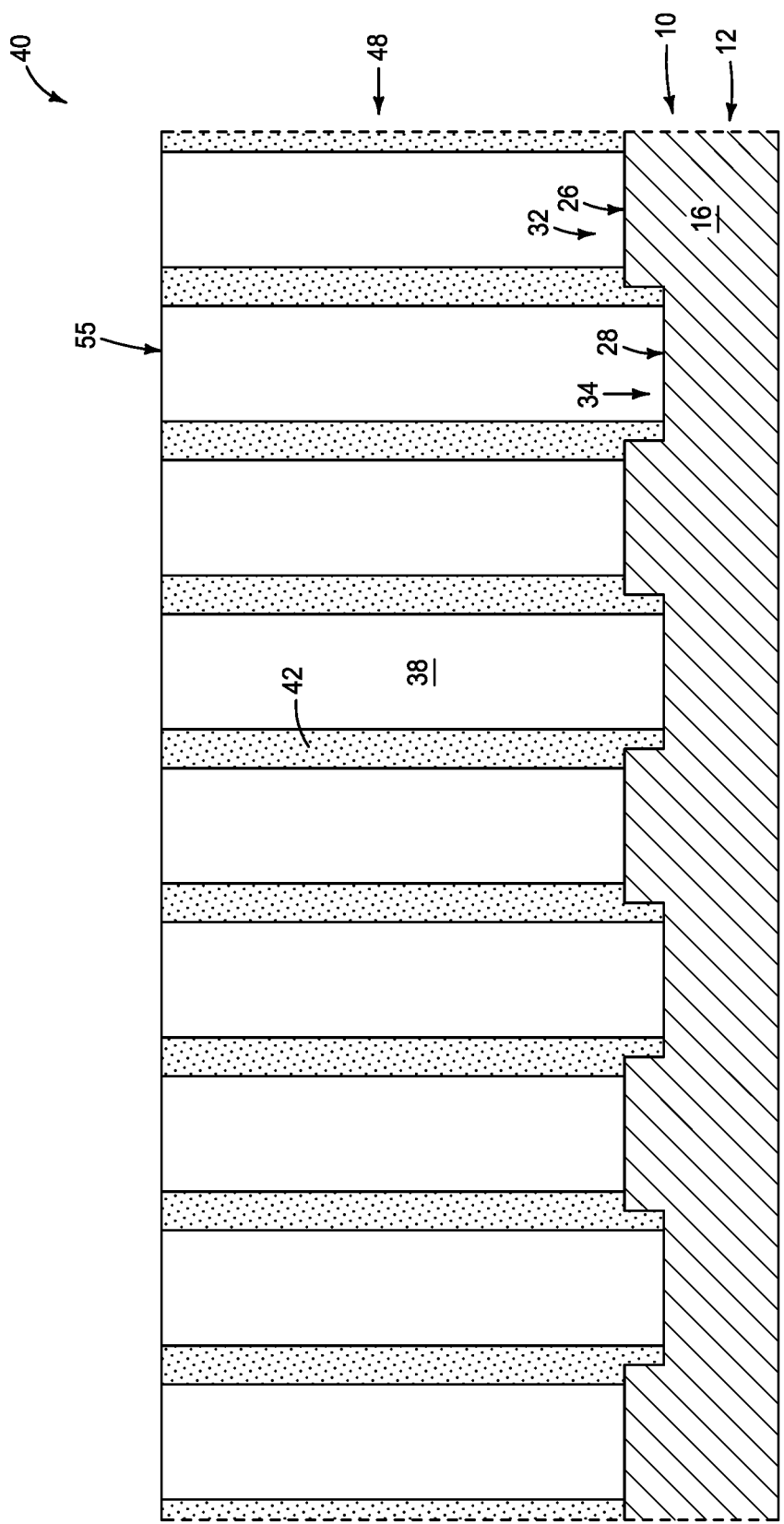
Figure 5B:
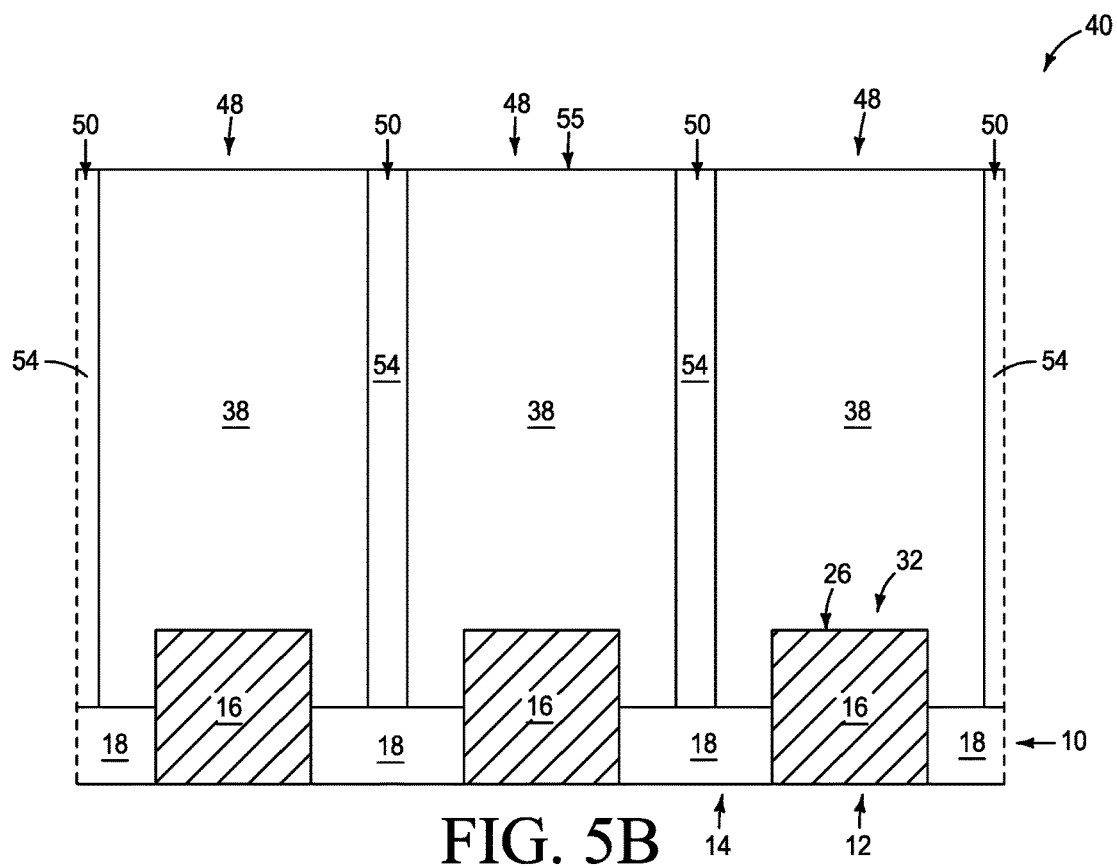
Figure 5C:
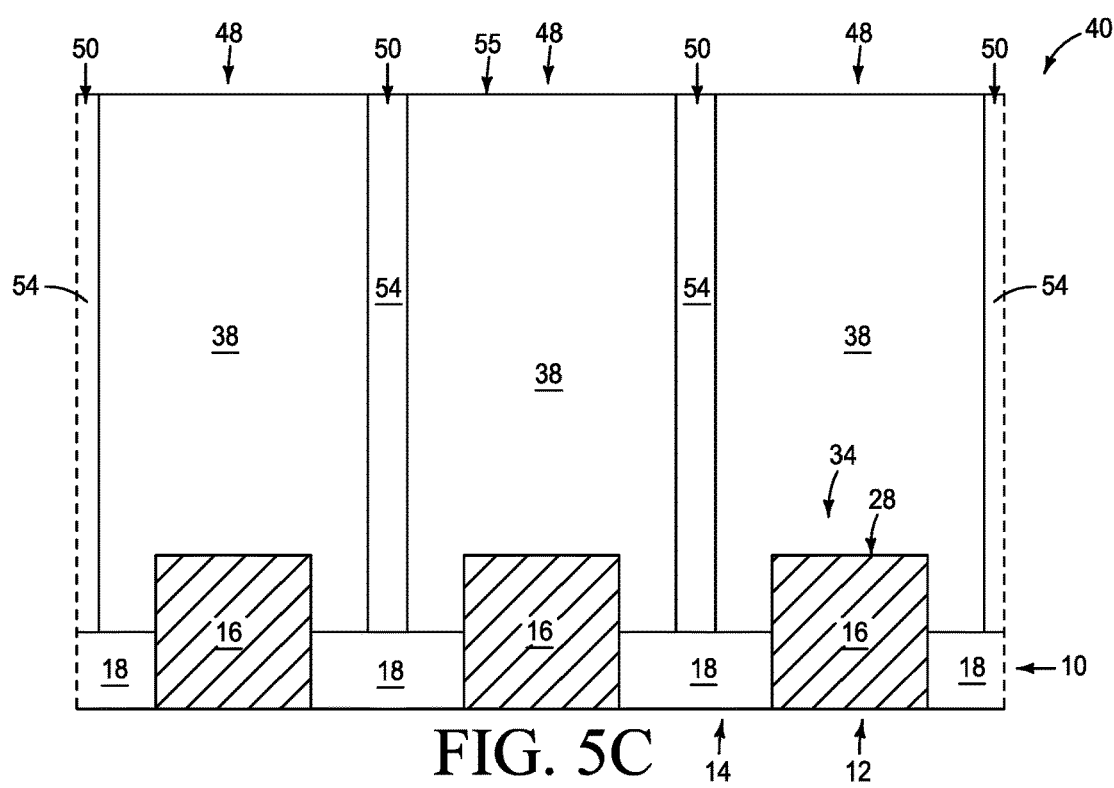

Referring to FIGS. 5-5C, insulative material 54 is formed within the gaps 50. The insulative material 54 may comprise any suitable composition(s). For instance, the insulative material 54 may comprise, consist essentially of, or consist of silicon dioxide.

The masking material 46 (FIGS. 4-4C) is removed, and a planarized surface 55 is formed across the materials 38 and 54. The planarized surface may be formed with any suitable processing, including, for example, chemical-mechanical polishing (CMP).

Figure 6:
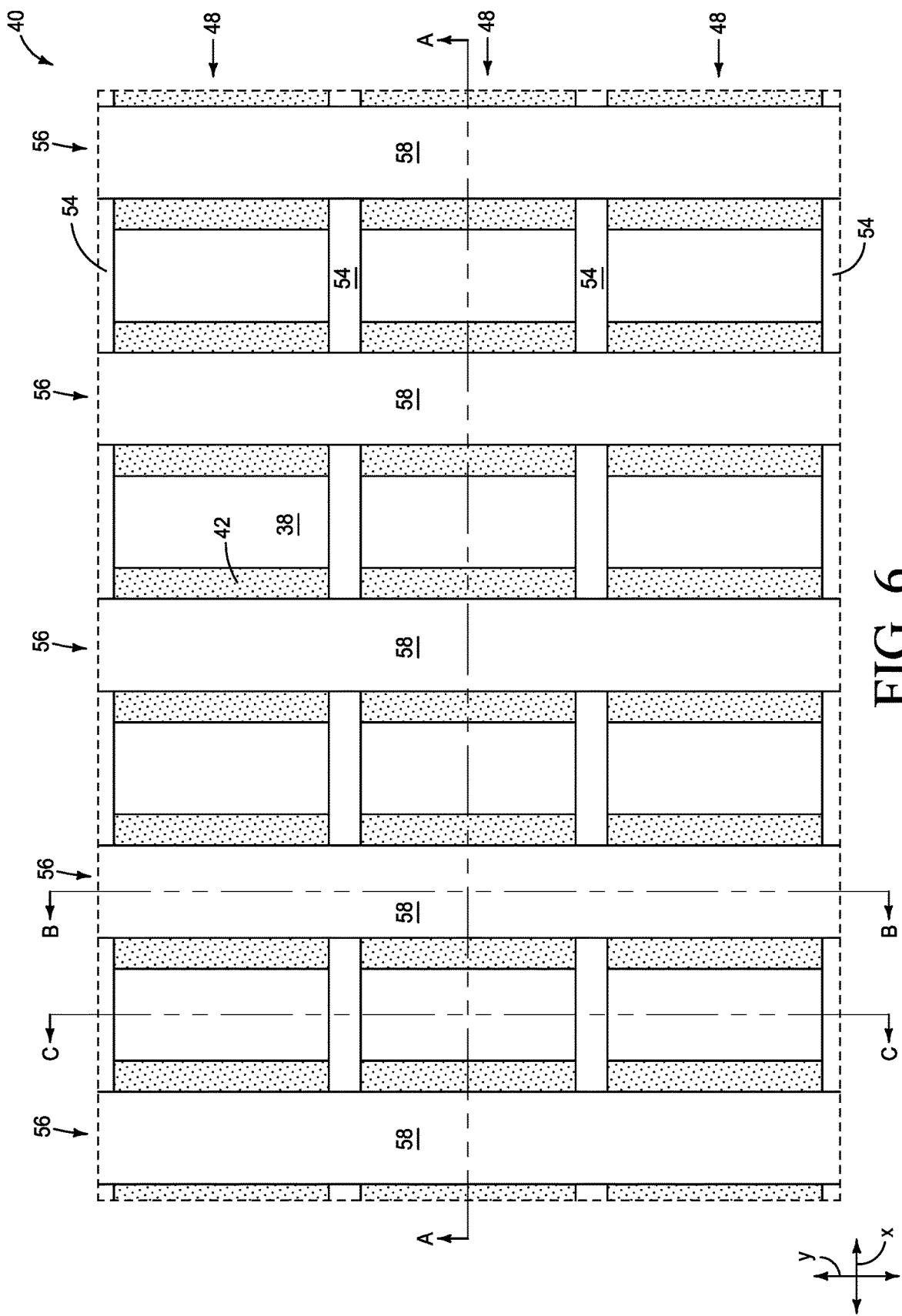
FIGS. 6-6C are diagrammatic views of a region of the example assembly of FIGS. 2-2C at an example process stage subsequent to that of FIGS. 5-5C.
Figure 6A:
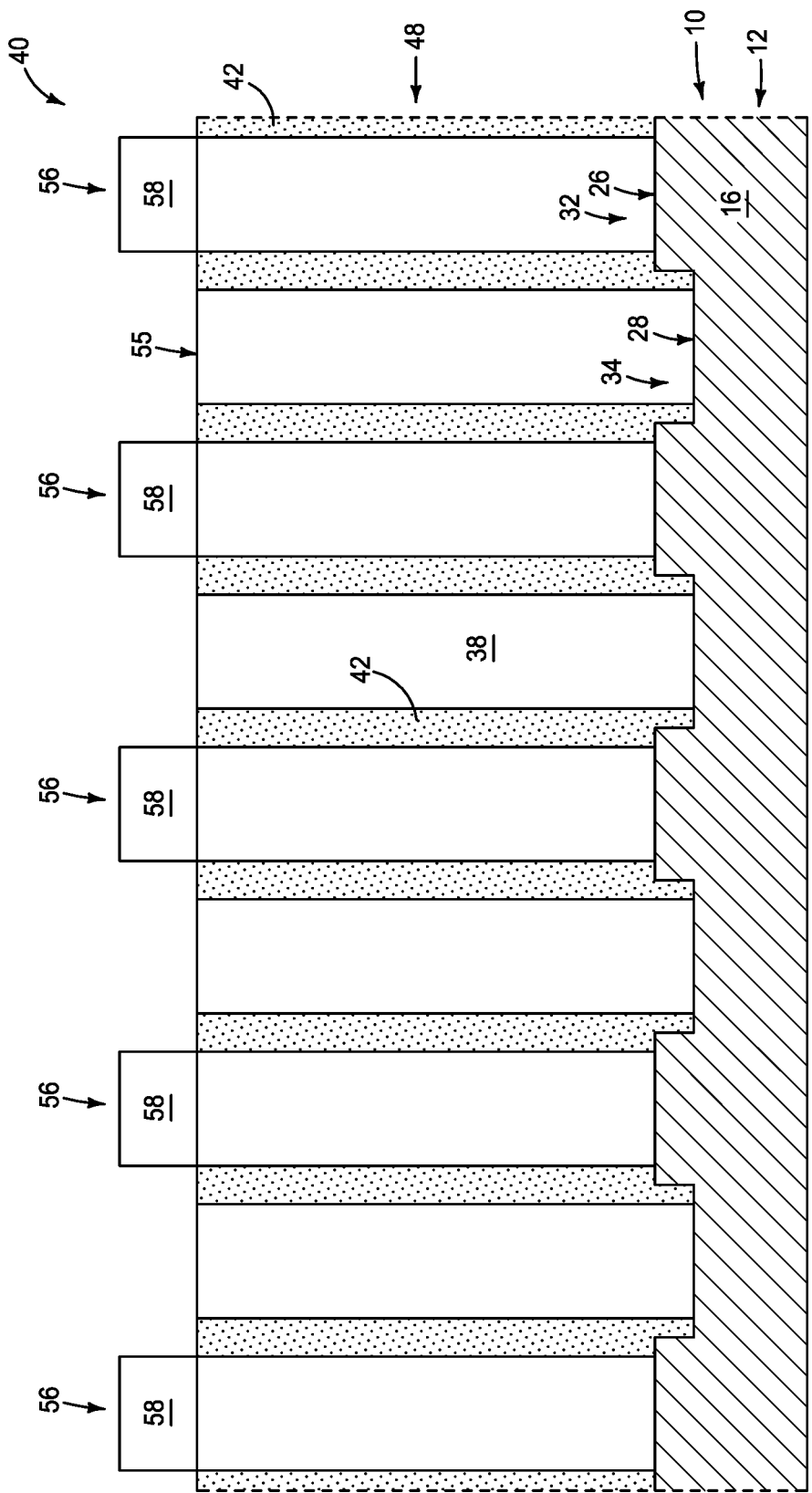
Figure 6B:
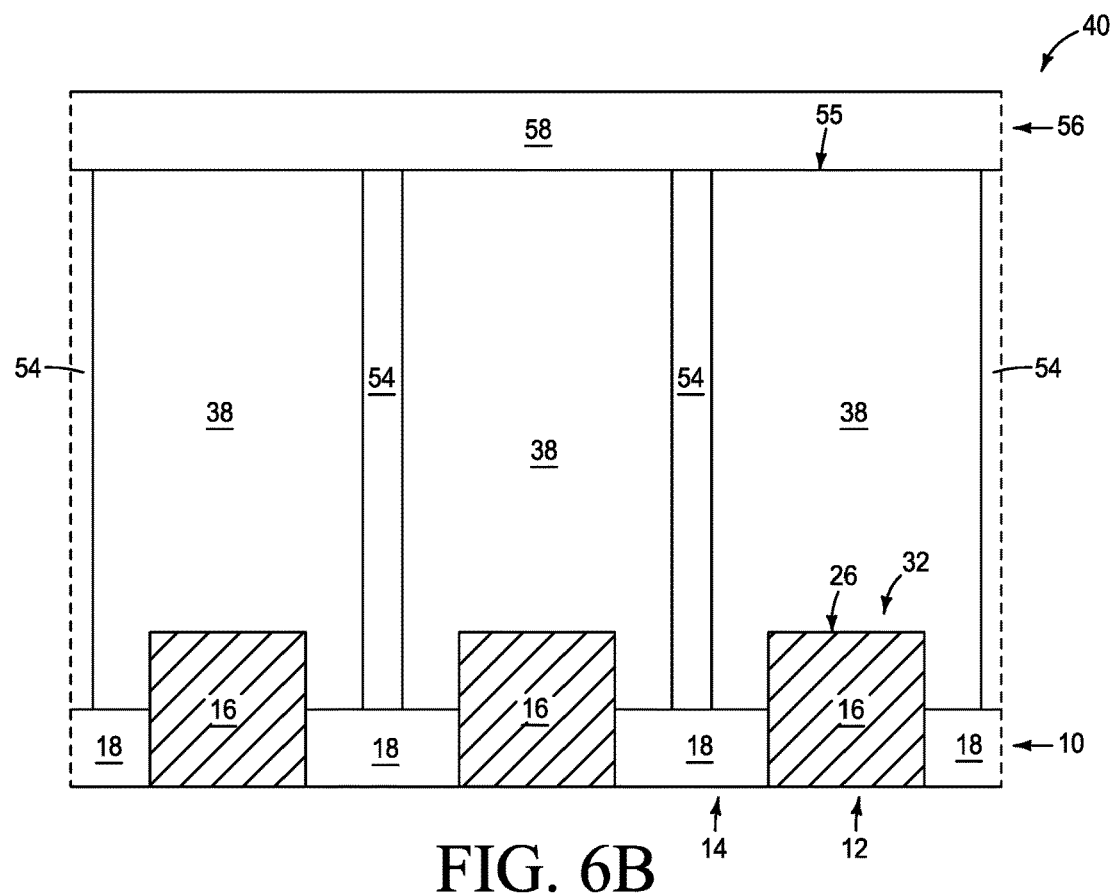
Figure 6C:
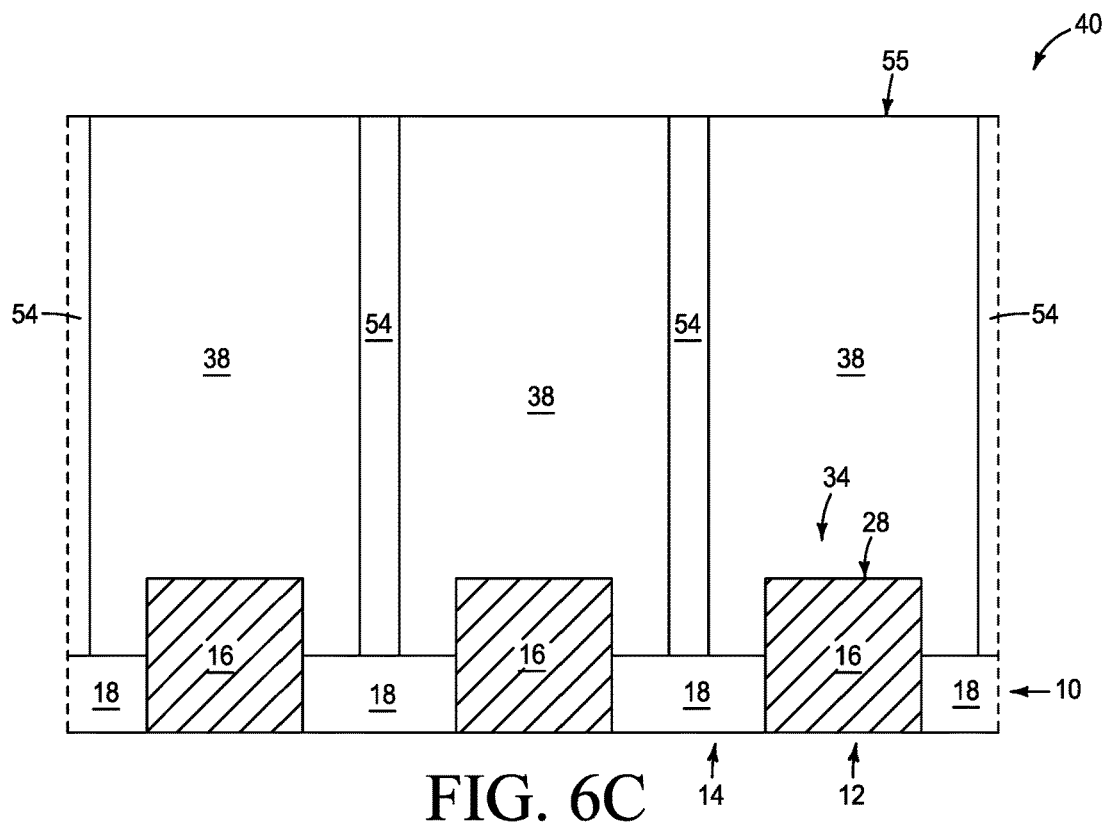

Referring to FIGS. 6-6C, second masking structures 56 are formed over the planarized surface 55. The second masking structures 56 comprise a second masking material 58. The second masking material 58 may comprise any suitable composition(s), and in some embodiments may comprise photolithographically-patterned photoresist.

The second masking structures 56 are illustrated to be linear structures which extend along the second direction (the y-axis direction). Such linear structures may be straight (as shown), or may be curved, wavy, etc.

Figure 7:
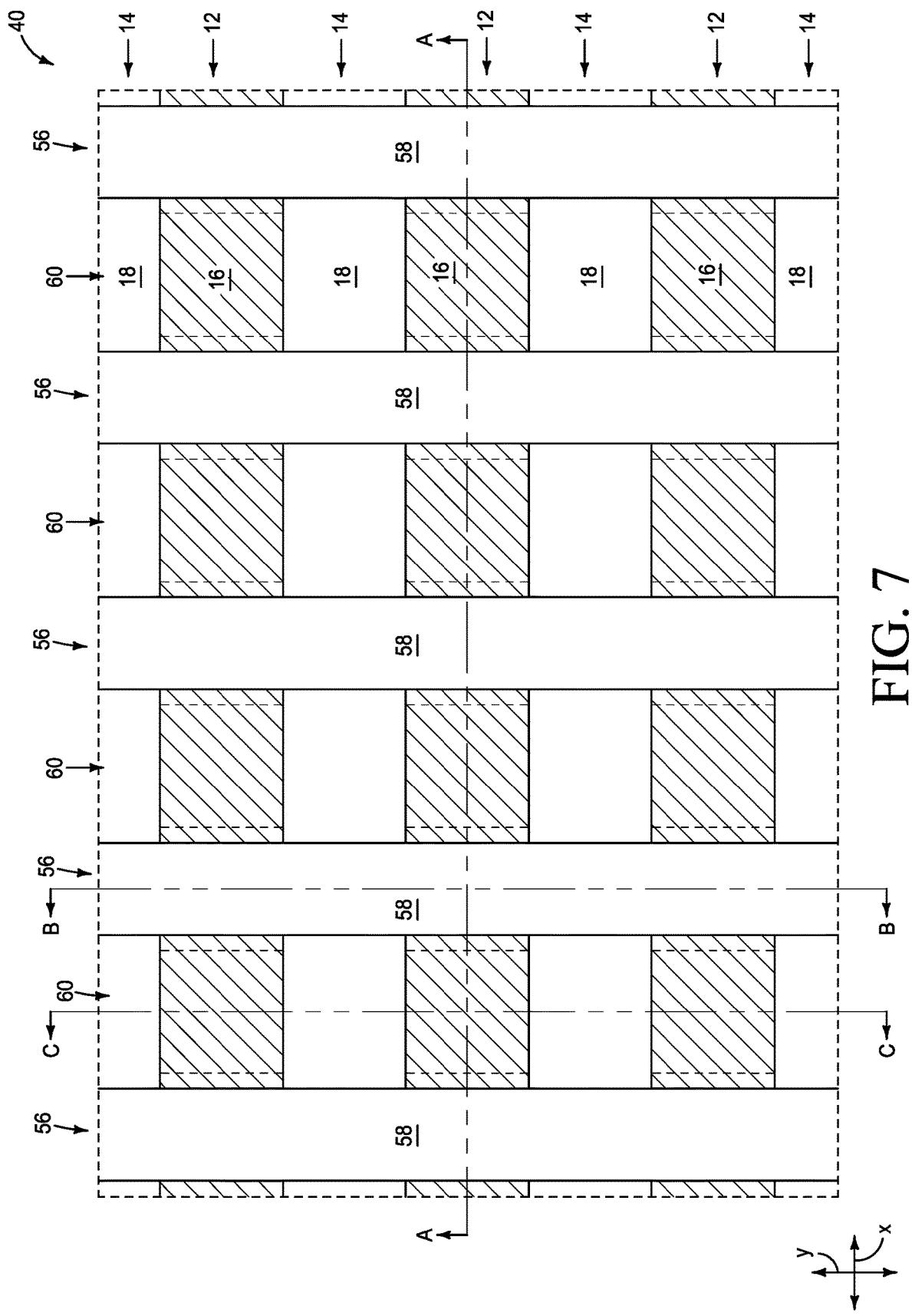
FIGS. 7-7C are diagrammatic views of a region of the example assembly of FIGS. 2-2C at an example process stage subsequent to that of FIGS. 6-6C.
Figure 7A:
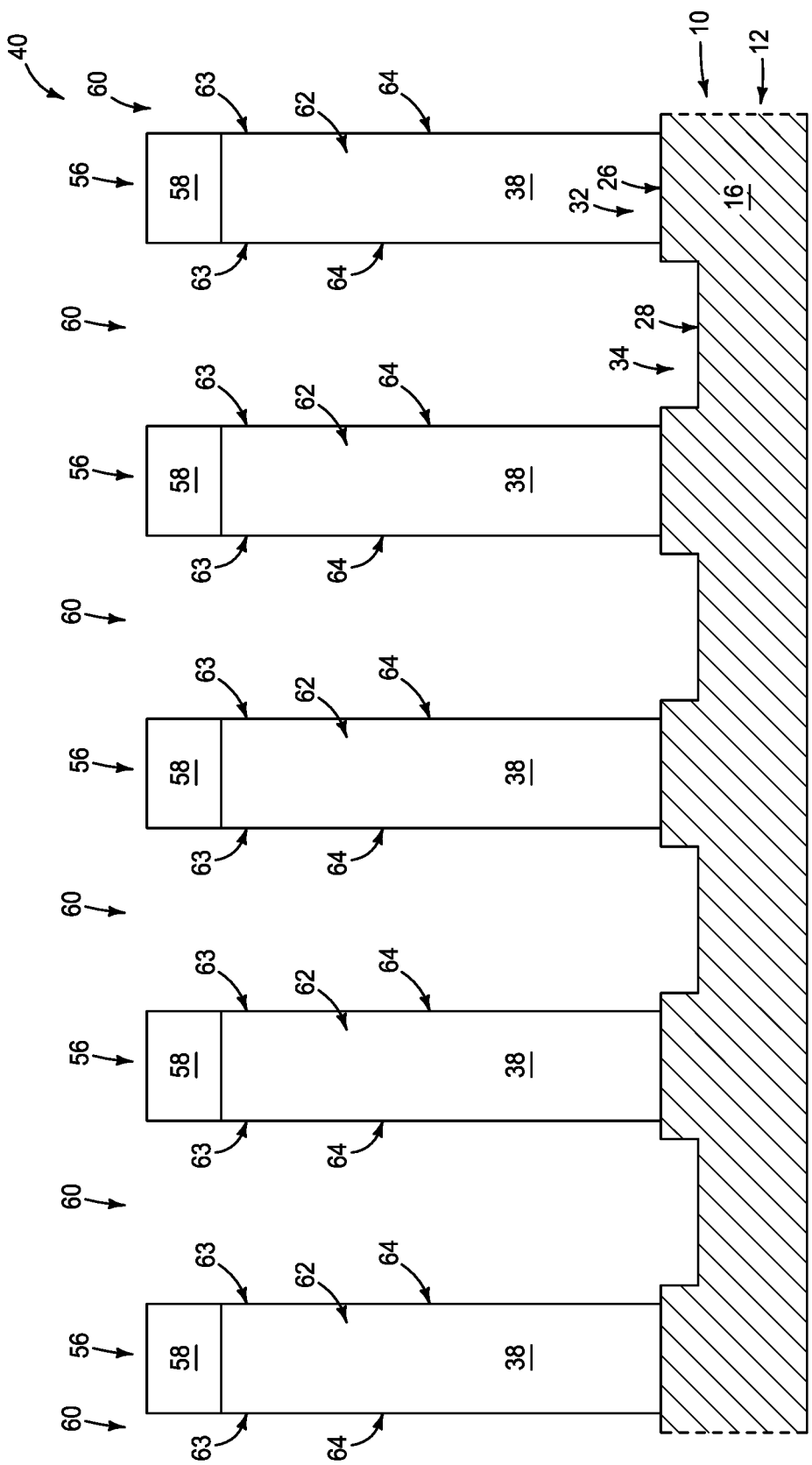
Figure 7B:
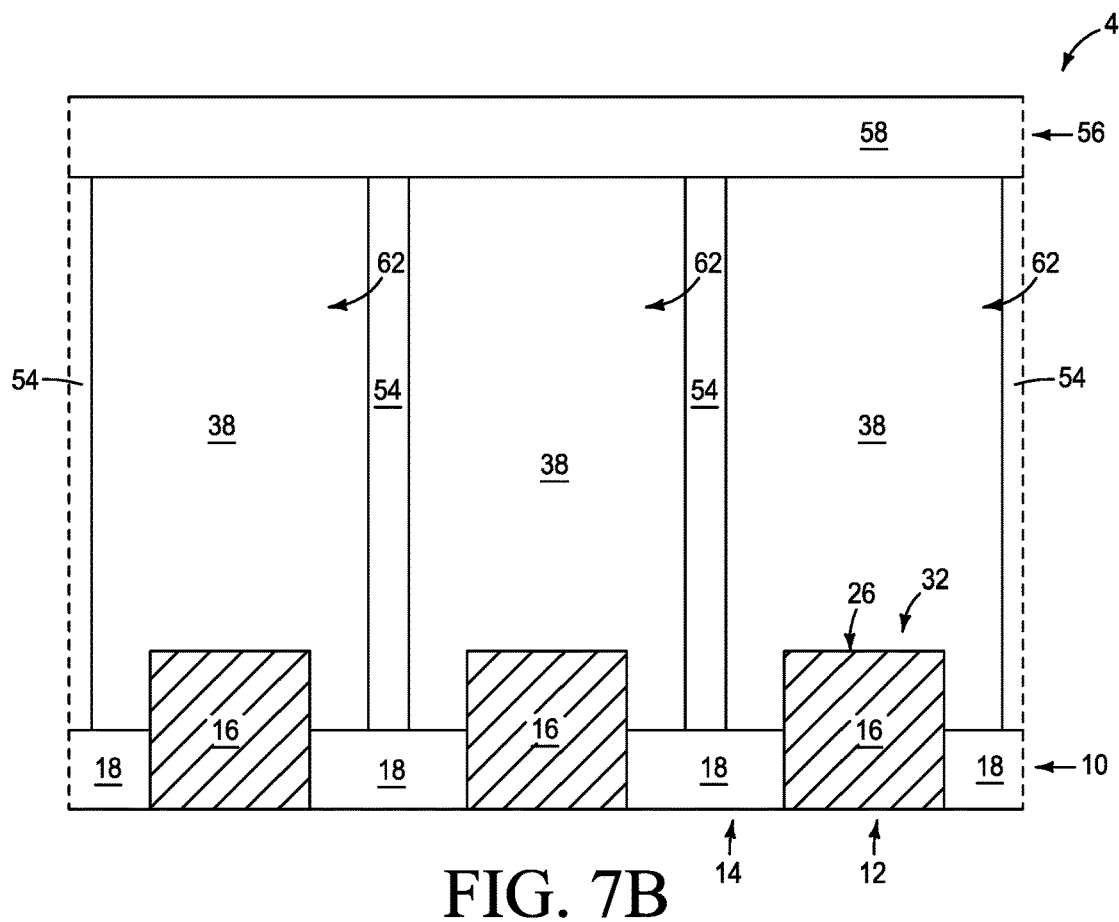
Figure 7C:
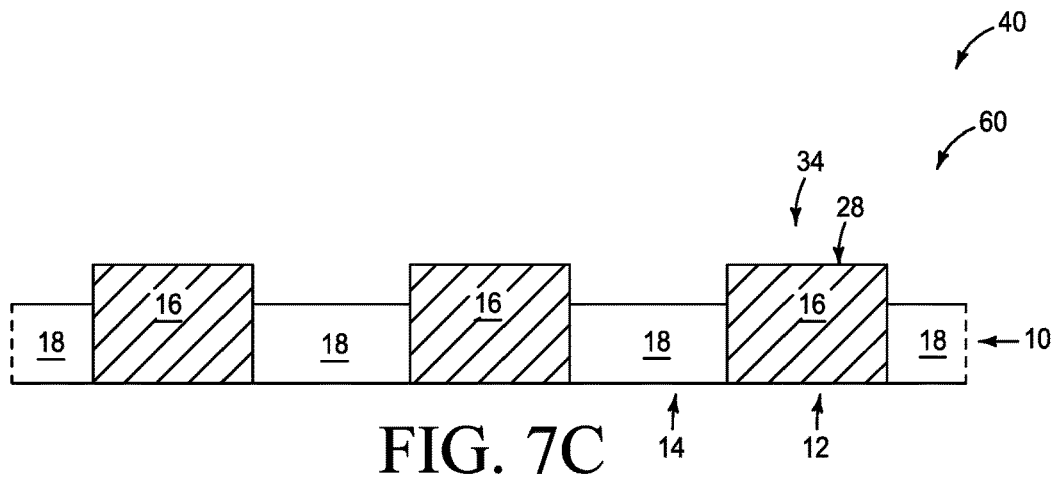

Referring to FIGS. 7-7C, a pattern is transferred from the second masking structures 56 into the semiconductor material 38. The pattern may be transferred into the semiconductor material 38 with any suitable etch or combination of etches. In some embodiments, dry etching (e.g., reactive ion etching) may be utilized. The etching forms gaps 60 which extend through the semiconductor material 38 to the underlying materials 16 and 18, and patterns the linear features 48 (FIGS. 6-6C) into pillars 62. The pillars 62 are aligned with the conductive steps 32, and are in one-to-one correspondence with the conductive steps 32 as shown in FIG. 7A.

The grain boundary regions 42 (FIGS. 6-6C) may advantageously improve the etch for reasons analogous to those described above with reference to the etching of FIGS. 4-4C. The pillars 62 may be considered to have sidewalls 64 along the cross-section of FIG. 7A, and such sidewalls may be considered to have substantially vertical surfaces 63. In some embodiments, the steps 32 may be considered to have substantially horizontal upper surfaces 26, and the sidewall surfaces 63 may be within about 15° of orthogonal to the substantially horizontal upper surfaces 26. In some embodiments, the sidewall surfaces 63 may be substantially orthogonal to the substantially horizontal upper surfaces 26 of the steps 32.

Figure 8:
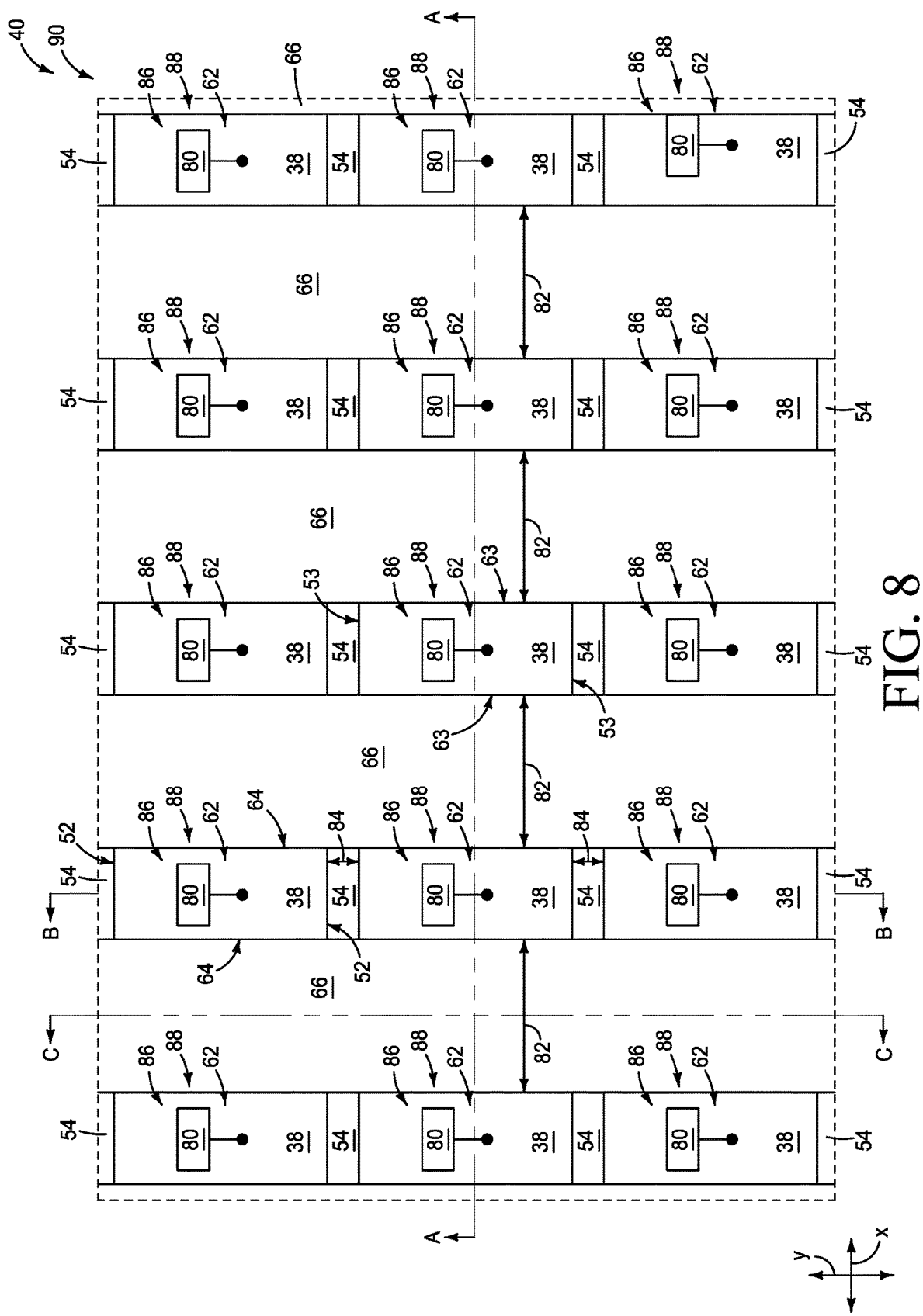
FIGS. 8-8C are diagrammatic views of a region of the example assembly of FIGS. 2-2C at an example process stage subsequent to that of FIGS. 7-7C.
Figure 8A:
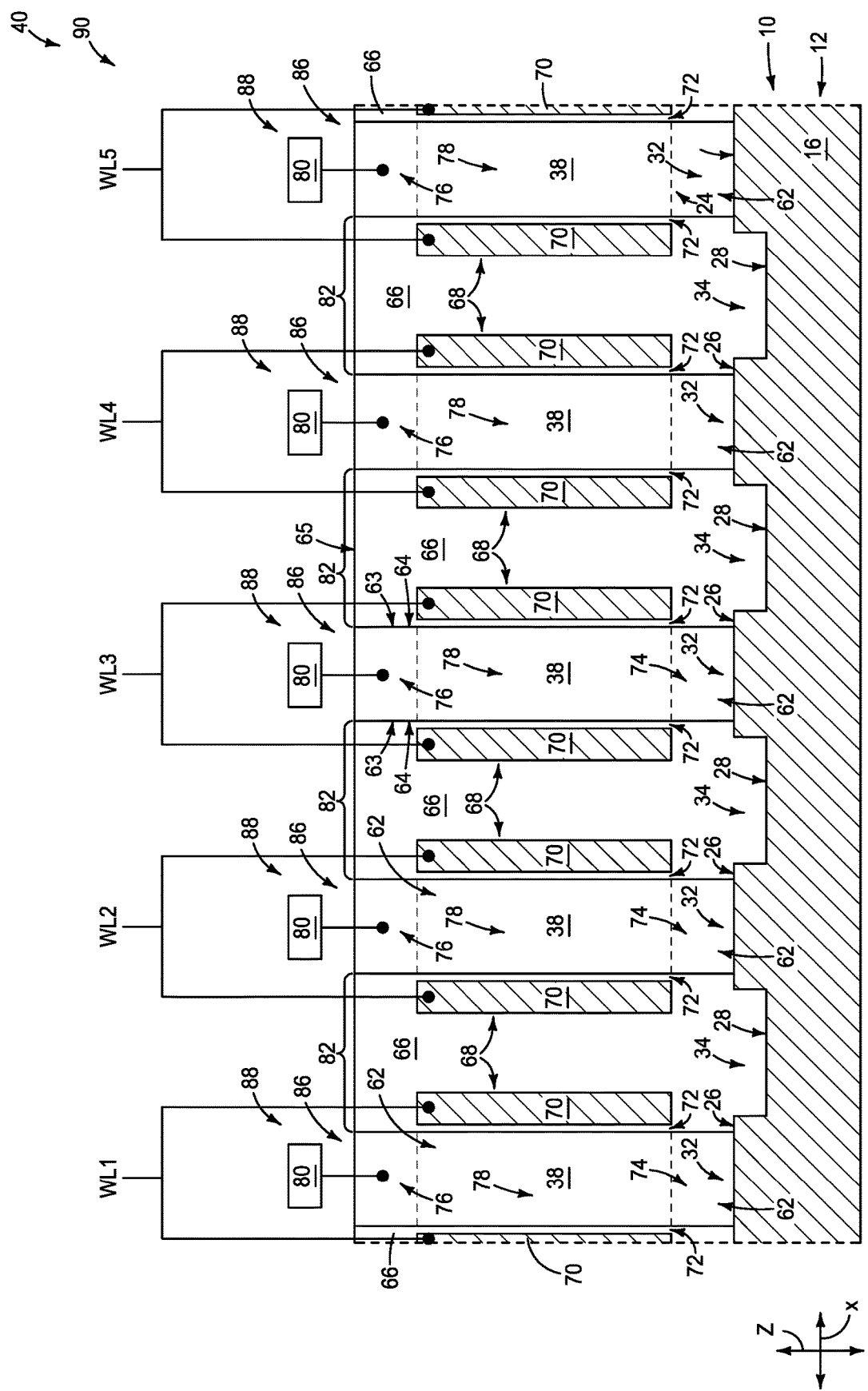
Figure 8B:
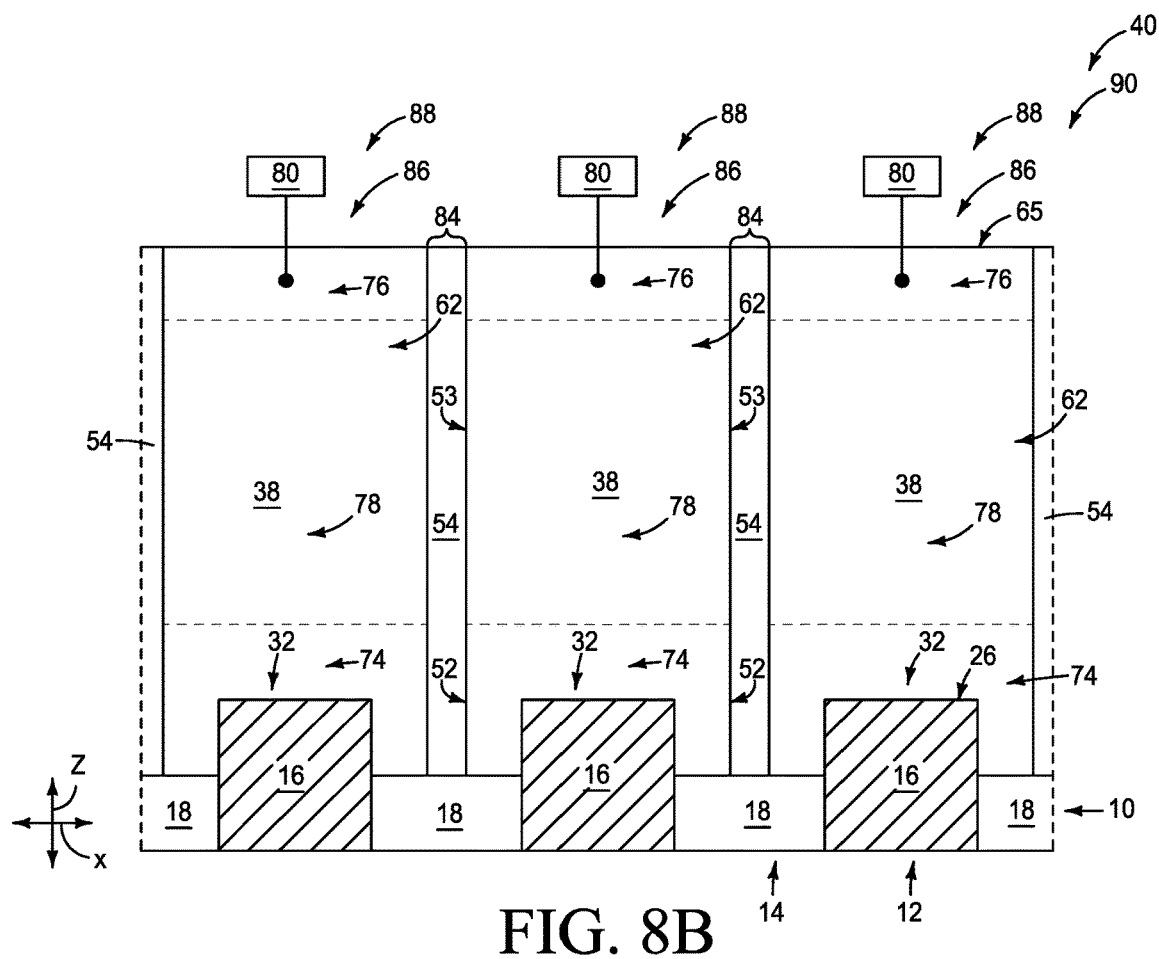
Figure 8C:
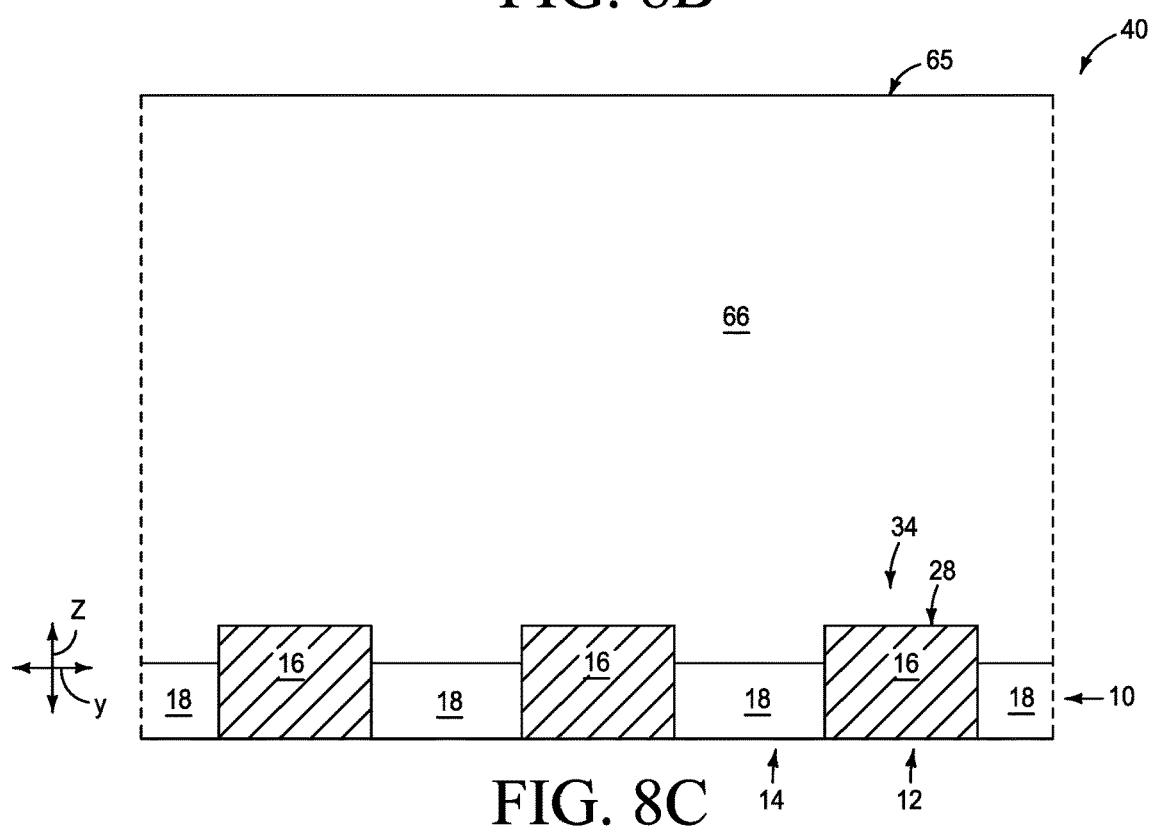

Referring to FIGS. 8-8C, conductive structures 68 are formed within the gaps 60 (FIGS. 7-7C), with the conductive structures 68 being visible along the cross-section of FIG. 8A. The conductive structures 68 comprise conductive material 70. The conductive material 70 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 70 may comprise a same composition as the conductive material 16 of the conductive structures 12, and in other embodiments the conductive material 70 may be compositionally different relative to the conductive material 16.

The conductive structures 68 may be referred to as second conductive structures to distinguish them from the first conductive structures 12. The conductive structures 68 may be linear structures which extend along the y-axis direction, and in some embodiments may correspond to wordlines, with example wordlines being labeled WL1, WL2, WL3, WL4 and WL5 in FIG. 8A. The wordlines are proximate the pillars 62, and are spaced from the semiconductor material 38 of the pillars 62 by intervening insulative material 72. The insulative material 72 may be referred to as gate dielectric material, and may comprise any suitable composition(s). In some embodiments, the insulative material 72 may comprise, consist essentially of, or consist of silicon dioxide.

Insulative material 66 is formed over and between the wordlines 68. The insulative material 66 may comprise any suitable composition(s). For instance, the insulative material 66 may comprise, consist essentially of, or consist of silicon dioxide. The insulative materials 54 and 66 may be compositionally the same as one another, or may be compositionally different relative to one another.

The insulative material 66 is shown merging with the gate dielectric material 72, as would be the case in embodiments in which the materials 66 and 72 comprise a same composition as one another (e.g., both consist of silicon dioxide). In other embodiments, the materials 66 and 72 may comprise different compositions relative to one another.

The masking material 58 (FIGS. 7-7C) is removed, and a planarized surface 65 is formed across the materials 38, 54 and 66. The planarized surface 65 may be formed with any suitable processing, including, for example, CMP.

The semiconductor material 38 within the pillars 62 is shown to be subdivided amongst source/drain regions 74 and 76, and a channel region 78 between the source/drain regions. The source/drain regions 74 are beneath the channel regions 78, and the source/drain regions 76 are above the channel regions 78. Dashed lines are provided to diagrammatically illustrate approximate boundaries between the source/drain regions and the channel regions.

The source/drain regions 74 and 76 may comprise a same composition as the channel regions 78 or may comprise different compositions than the channel regions. Regardless, the source/drain regions may comprise heavier doping than the channel regions. The source/drain regions 74 and 76 may comprise a same composition as one another, or may comprise different compositions relative to one another. The regions 74, 76 and 78 may be formed within the semiconductor material 38 at any suitable process stage, and in some embodiments may be formed during the deposition of the material 38 at the process stage of FIGS. 2-2C. In some embodiments, one or both of the regions 74 and 76 may comprise conductive material instead of semiconductor material 38. If the material of the source/drain regions 74 is conductive material (e.g., a conductive metal oxide, such as zinc oxide, indium tin oxide, etc.), the semiconductor material 38 may be formed over the material of the source/drain regions 74 rather than directly on the conductive material 16 of the structures 12 at the process stage of FIGS. 2-2C.

The lower source/drain regions 74 are electrically coupled with the conductive structures 12.

The upper source/drain regions 76 are electrically coupled with storage elements 80. The storage elements 80 may be any suitable devices having at least two detectable states; and in some embodiments may be, for example, capacitors, resistive-memory devices, conductive-bridging devices, phase-change-memory (PCM) devices, programmable metallization cells (PMCs), etc.

The wordlines 68 may be considered to be operatively adjacent to (operatively proximate to) the channel regions 78 such that a sufficient voltage applied to an individual wordline will induce electric fields within associated channel regions which enables current flow through the channel regions to electrically couple the source/drain regions on opposing sides of the channel regions with one another. If the voltage to the wordline is below a threshold level, the current will not flow through the channel regions, and the source/drain regions on opposing sides of the channel regions will not be electrically coupled with one another. The selective control of the coupling/decoupling of the source/drain regions through the level of voltage applied to the wordlines may be referred to as gated coupling of the source/drain regions.

The illustrated pillars 62 are four-sided structures in the top-down view of FIG. 8, with the four sides of individual pillars comprising the opposing sidewalls 64 and the opposing sidewalls 52. The pillars 62 may have other configurations in other embodiments. For instance, the pillars may be other four-sided structures, may have three sides, may have more than four sides, may be circular, may be elliptical, etc. In some embodiments, the four-sided structures of the shown embodiment may be referred to as being substantially four-sided to indicate that they are four-sided to within reasonable tolerances of fabrication and measurement.

The pillars 62 are shown to be arranged within a cubic packing system. In other embodiments, the pillars may be arranged within other packing systems, such as, for example, hexagonal close packed systems, etc.

In some embodiments, the pillars 62 may be considered to be spaced from one another by first intervening regions 82 along the first direction (x-axis direction), and by second intervening regions 84 along the second direction (y-axis direction). The pillars 62 have the first sidewall surfaces 63 along the first intervening regions 82, and have the second sidewall surfaces 53 along the second intervening regions 84. In some embodiments, the first and second sidewall surfaces 53 and 63 may be substantially vertical. For instance, the steps 32 may be considered to comprise the substantially horizontal upper surfaces 26, and the sidewall surfaces 63 and 53 may be within about 15° of orthogonal to such substantially horizontal upper surfaces, and in some embodiments may be substantially orthogonal to such substantially horizontal upper surfaces.

The vertical sidewall surfaces 53 and 63 of the pillars 62 may be advantageous in enabling the pillars to be arranged in tightly-packed (highly-integrated) configurations. Also, the substantially vertical sidewalls 63 along the illustrated x-axis direction (FIG. 8A) may enable the wordlines 68 to be formed without problematic shorting of the wordlines along bottom regions of the pillars 62 which could otherwise occur in configurations in which the sidewalls 63 taper toward one another at the bottoms of the intervening regions 82. Also, the vertical sidewall surfaces 53 and 63 of the pillars 62 may enable the pillars to have uniform widths across the channel regions 78 which may improve threshold voltage characteristics of the pillars, subthreshold slopes of the pillars, etc., as compared to pillars which are less uniform across the channel regions. Additionally, the uniformity of widths across the channel regions may enable desired uniformity of performance characteristics across an array of the pillars 62.

Figure 9:
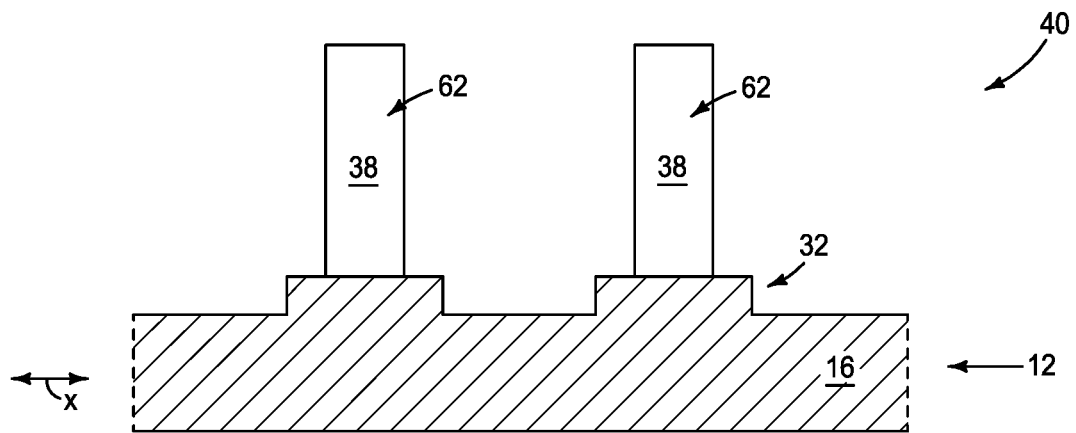
FIGS. 9-11 are diagrammatic cross-sectional side views along a cross-section analogous to that of FIG. 7A, and show alternative configurations.
Figure 10:
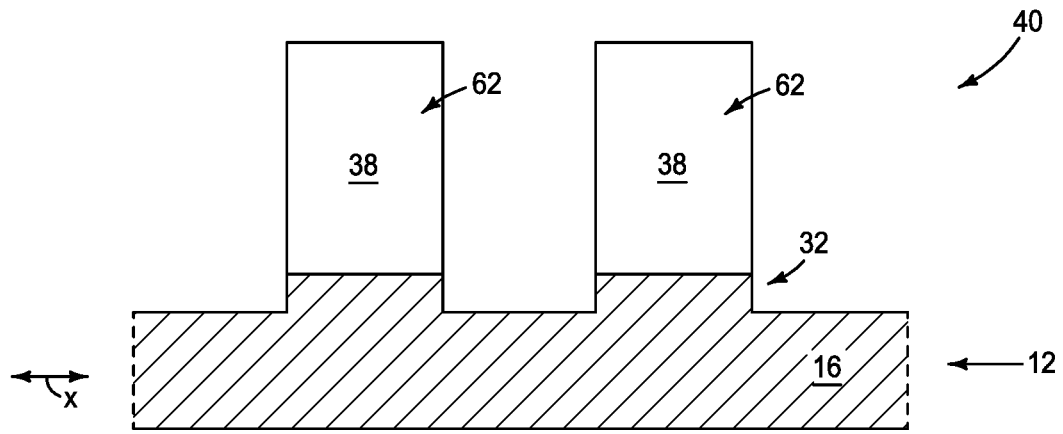
Figure 11:
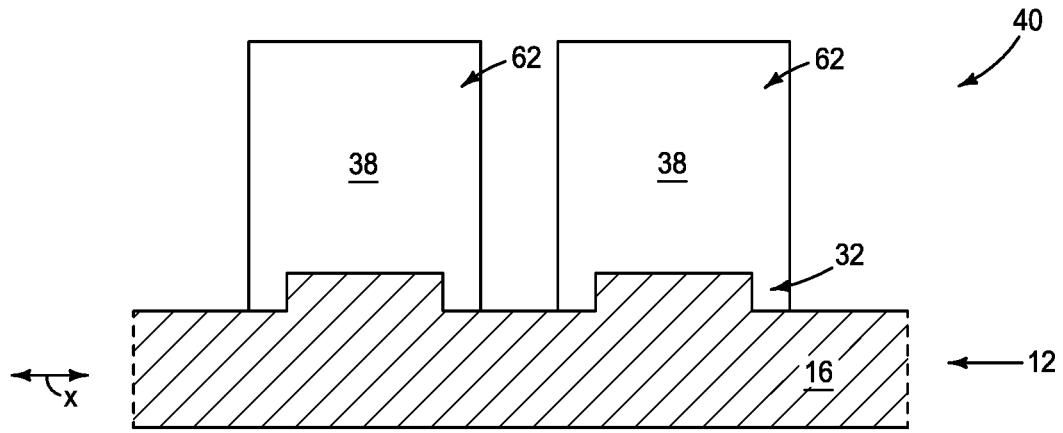
Figure 12:
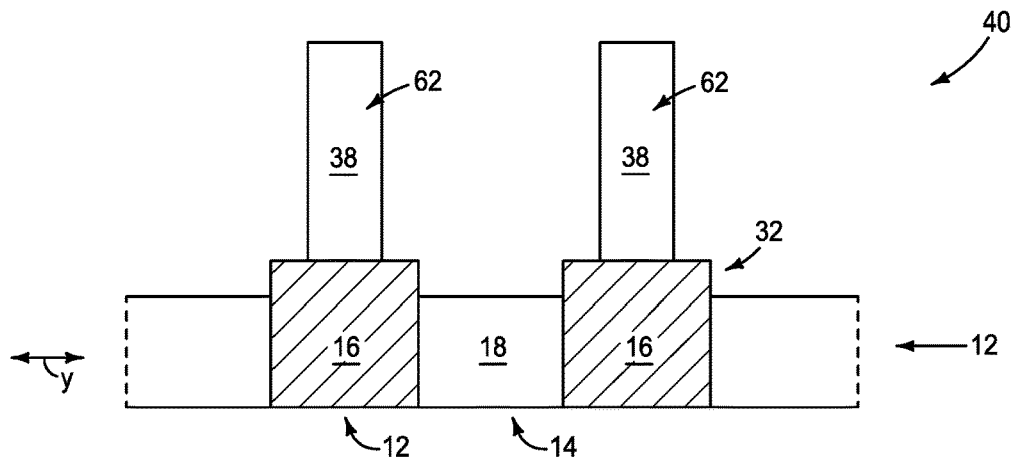
FIGS. 12-14 are diagrammatic cross-sectional side views along a cross-section analogous to that of FIG. 7B, and show alternative configurations.
Figure 13:
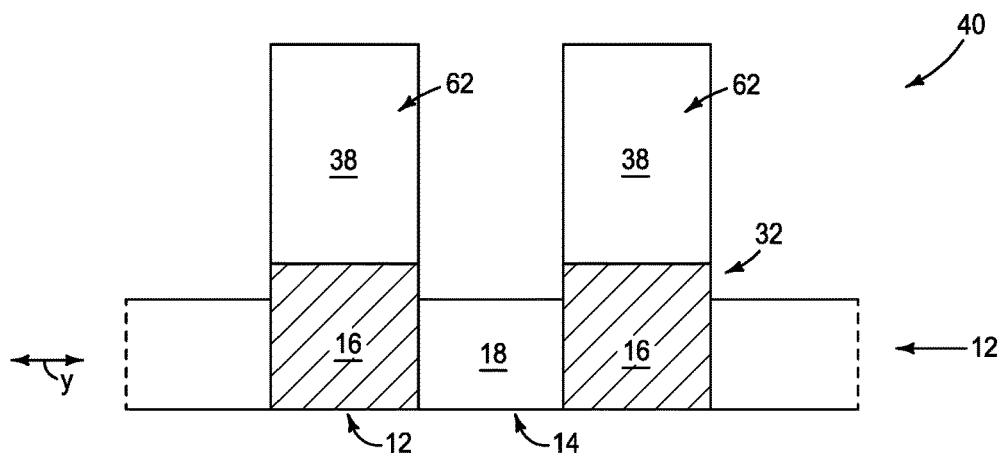
Figure 14:
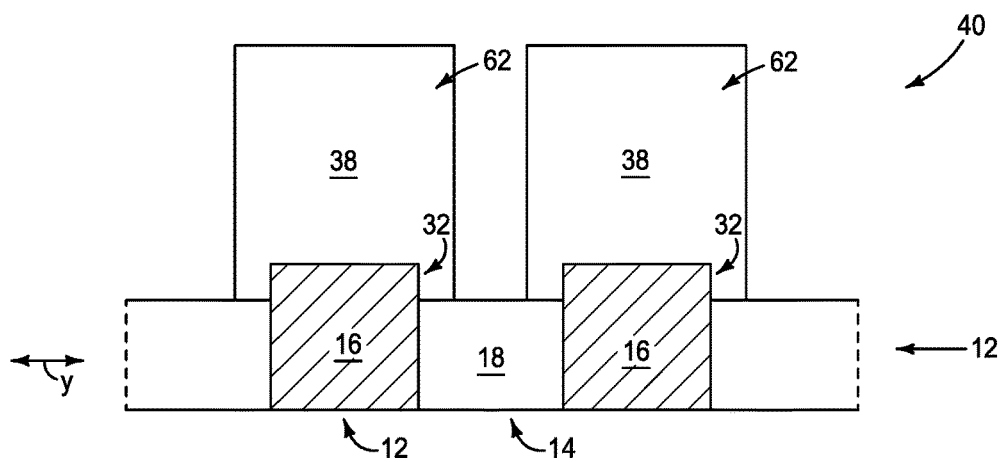

The embodiment of FIGS. 8-8C has the pillars 62 with a narrower width than the steps 32 along the x-axis direction (as shown in FIG. 8A), and has the pillars 62 with a wider with than the steps 32 along the y-axis direction (as shown in FIG. 8B). The relationship of the widths of the pillars 62 to the widths of the steps 32 may be tailored for particular applications. For instance, FIGS. 9-11 show example embodiments of the integrated assemblies 40 in which the pillars 62 have example configurations in which the pillars are narrower than the widths of the steps 32 (FIG. 9), substantially the same widths as the widths of the steps 32 (FIG. 10) or wider than the widths of the steps 32 (FIG. 11)

along the direction of the x-axis (the so-called "first direction"). Also, FIGS. 12-14 show example embodiments of the integrated assemblies 40 in which the pillars 62 have example configurations in which the pillars are narrower than the widths of the steps 32 (FIG. 12), substantially the same widths as the widths of the steps 32 (FIG. 13) or wider than the widths of the steps 32 (FIG. 14) along the direction of the y-axis (the so-called "second direction").

The assembly 40 of FIGS. 8-8C may be an integrated assembly comprising integrated memory. The pillars 62 may be incorporated into access devices 86, with active regions of such devices including the semiconductor material 38. Memory devices 88 may include the storage elements 80 together with the access devices 86. In some embodiments, the storage elements 80 may be considered to be memory cells of the memory devices 88. The memory devices 88 may be considered to be arranged within a memory array 90.

A memory array 90 comprising the memory devices 88 may comprise any suitable configuration. FIG. 15 shows an example configuration for a DRAM array 90. Such configuration has the digit lines 12 (DL1-DL4) coupled with sensing circuitry 100 and extending along columns of the array, and has the wordlines 68 (WL1-WL4) coupled with driver circuitry 102 and extending along rows of the array. Memory devices 88 comprise the access transistors 86 and the storage elements 80, with the illustrated storage elements being configured as capacitors. Each of the capacitors has a first electrical node coupled with an associated access device 86, and has a second electrical node coupled with a reference voltage source 92 (e.g., a common plate voltage, such as, for example, ground, VCC/2, etc.). Each of the memory devices 88 is uniquely addressed by one of the digit lines in combination with one of the wordlines.

The sensing circuitry 100 may be sense-amplifier-circuitry, and may be within a logic-circuitry-region (e.g., a CMOS region) provided under the array 90, or in any other suitable location. Similarly, the driver circuitry 102 (wordline-driver-circuitry) may be within a logic-circuitry-region (e.g., a CMOS region) provided under the array 90, or in any other suitable location.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly which includes a base structure. The base structure includes a series of conductive structures which extend along a first direction. The conductive structures have steps which alternate with recessed regions along the first direction. Pillars of semiconductor material are over the steps. The semiconductor material includes at least one element selected from Group 13 of the periodic table in combination with at least one element selected from Group 16 of the periodic table.

Some embodiments include integrated memory comprising a base structure. The base structure includes a series of first conductive structures which extend along a first direction. The first conductive structures have steps which alternate with recessed regions along the first direction. The steps have substantially horizontal first upper surfaces and the recessed regions have second upper surfaces which are beneath the first upper surfaces. Pillars of semiconductor material are over the steps. The semiconductor material comprises at least one element selected from Group 13 of the periodic table in combination with at least one element selected from Group 16 of the periodic table. The pillars have substantially vertical sidewall surfaces. The pillars comprise channel regions vertically between first and second source/drain regions. The first source/drain regions are under the channel regions and are coupled with the first conductive structures. Second conductive structures extend along a second direction which is substantially orthogonal to the first direction. The second conductive structures are adjacent to the sidewall surfaces and are proximate to the channel regions. Storage elements are coupled with the upper source/drain regions.

Some embodiments include a method of forming an integrated assembly. A template structure is formed to include an undulating topography which includes first surfaces vertically offset relative to second surfaces, and which includes transition regions between the first and second surfaces. The first surfaces are conductive and are associated with a conductive structure which extends along a first direction. The conductive structure has a pair of opposing sidewalls. A first set of the second surfaces are along the conductive structure and alternate with the first surfaces along the first direction. A second set of the second surfaces are associated with insulative material along the opposing sidewalls of the conductive structure. Semiconductor material is deposited over the template structure. Grain boundaries are generated by the transition regions during the deposition. Etching is conducted at least along the grain boundaries to divide the semiconductor material into pillars, with the pillars extending upwardly from the first surfaces.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a base structure comprising a series of conductive structures extending along a first direction; the conductive structures having steps alternating with recessed regions along the first direction; and
   pillars of semiconductor material supported against upper surfaces of the steps; the semiconductor material comprising at least one element selected from Group 13 of the periodic table in combination with at least one element selected from Group 16 of the periodic table.

2. The integrated assembly of claim 1 wherein the pillars are wider than the steps along the first direction.

3. The integrated assembly of claim 1 wherein the pillars are narrower than the steps along the first direction.

4. The integrated assembly of claim 1 wherein the pillars are about a same width as the steps along the first direction.

5. The integrated assembly of claim 1 wherein the pillars are wider than the steps along a second direction orthogonal to the first direction.

6. The integrated assembly of claim 1 wherein the pillars are narrower than the steps along a second direction orthogonal to the first direction.

7. The integrated assembly of claim 1 wherein the pillars are about a same width as the steps along a second direction orthogonal to the first direction.

8. The integrated assembly of claim 1 wherein the pillars are spaced from one another by intervening regions along the first direction; wherein the pillars have sidewall surfaces along the intervening regions; wherein the upper surfaces of the steps are substantially horizontal; and wherein the sidewall surfaces are within about 15° of orthogonal to the substantially horizontal upper surfaces.

9. The integrated assembly of claim 8 wherein the sidewall surfaces are substantially orthogonal to the substantially horizontal upper surfaces.

10. The integrated assembly of claim 8 wherein the sidewall surfaces are first sidewall surfaces and the intervening regions are first intervening regions; wherein the pillars are spaced from one another by second intervening regions along a second direction orthogonal to the first direction; wherein the pillars have second sidewall surfaces along the second intervening regions; and wherein the second sidewall surfaces are within about 15° of orthogonal to the substantially horizontal upper surfaces.

11. The integrated assembly of claim 10 wherein the second sidewall surfaces are substantially orthogonal to the substantially horizontal upper surfaces.

12. The integrated assembly of claim 1 wherein the semiconductor material comprises semiconductor oxide material.

13. The integrated assembly of claim 1 wherein the semiconductor material comprises InGaZnO, where the chemical formula indicates primary constituents rather than a specific stoichiometry.

14. The integrated assembly of claim 1 wherein the conductive structures comprise metal-containing material.

15. The integrated assembly of claim 1 wherein the conductive structures comprise one or more of W, Ru and Mo.

16. The integrated assembly of claim 15 wherein the semiconductor material directly contacts the conductive structures.

17. The integrated assembly of claim 1 wherein the upper surfaces of the steps are higher than upper surfaces of the recessed regions by at least about 2 nm.

18. The integrated assembly of claim 1 wherein the upper surfaces of the steps are higher than upper surfaces of the recessed regions by at least about 5 nm.

19. The integrated assembly of claim 1 wherein the upper surfaces of the steps are higher than upper surfaces of the recessed regions by an amount within a range of from about 5 nm to about 10 nm.

20. The integrated assembly of claim 1 wherein the base structure comprises a series of insulative structures extending along the first direction between the conductive structures, the insulative structures are below the recessed regions of the conductive structures.

21. The integrated assembly of claim 20 further comprising insulative liners between the insulative structures and the conductive structures.

22. The integrated assembly of claim 21 wherein the insulative liners comprise an insulative material different from an insulative material of the insulative structures.

23. The integrated assembly of claim 21 wherein the insulative liners comprise silicon nitride.

24. The integrated assembly of claim 21 wherein the insulative liners are below the recessed regions of the conductive structures.

25. The integrated assembly of claim 1 wherein the semiconductor material of the pillars comprises homogeneous.

26. The integrated assembly of claim 1 wherein an entirety of the conductive structures comprise only a single material, the single material comprises a metal.

27. The integrated assembly of claim 26 wherein the metal is one of W, Ru and Mo.

28. The integrated assembly of claim 1 wherein the pillars of the semiconductor material are between the recessed regions.

29. Integrated memory, comprising:
   a base structure comprising a series of first conductive structures extending along a first direction; the first conductive structures having steps alternating with recessed regions along the first direction; the steps having substantially horizontal first upper surfaces and the recessed regions having second upper surfaces which are beneath the first upper surfaces;

pillars of semiconductor material over the steps; the semiconductor material comprising at least one element selected from Group 13 of the periodic table in combination with at least one element selected from Group 16 of the periodic table; the pillars having substantially vertical sidewall surfaces; the pillars comprising channel regions vertically between first and second source/drain regions; the first source/drain regions being under the channel regions and being coupled with the first conductive structures;

second conductive structures extending along a second direction substantially orthogonal to the first direction; the second conductive structures being adjacent to the sidewall surfaces and being proximate to the channel regions; and storage elements coupled with the upper source/drain regions.

30. The integrated memory of claim 29 comprising insulative material between the first conductive structures; and wherein the insulative material comprises one or both of silicon dioxide and silicon nitride.

31. The integrated memory of claim 30 wherein the insulative material comprises the silicon nitride, and wherein the silicon nitride has an uppermost surface beneath the second upper surfaces of the recessed regions.

32. The integrated memory of claim 29 wherein the semiconductor material comprises semiconductor oxide.

33. The integrated memory of claim 29 wherein the first conductive structures are digit lines and are coupled with sensing circuitry.

34. The integrated memory of claim 29 wherein the second conductive structures are wordlines and are coupled with driver circuitry.

35. The integrated memory of claim 29 wherein the storage elements are capacitors.

36. A method of forming an integrated assembly, comprising:

forming a template structure to include an undulating topography which includes first surfaces vertically offset relative to second surfaces, and which includes transition regions between the first and second surfaces; the first surfaces being conductive and being associated with a conductive structure which extends along a first direction; the conductive structure having a pair of opposing sidewalls; a first set of the second surfaces being along the conductive structure and alternating with the first surfaces along the first direction; a second set of the second surfaces being associated with insulative material along the opposing sidewalls of the conductive structure;

depositing semiconductor material over the template structure; grain boundaries being generated by the transition regions during the deposition; and etching at least along the grain boundaries to divide the semiconductor material into pillars, with the pillars extending upwardly from the first surfaces.

37. The method of claim 36 wherein the semiconductor material comprises at least one element selected from Group 13 of the periodic table in combination with at least one element selected from Group 16 of the periodic table.

38. The method of claim 36 wherein the semiconductor material comprises semiconductor oxide material.

39. The method of claim 36 wherein the semiconductor material comprises InGaZnO, where the chemical formula indicates primary constituents rather than a specific stoichiometry.

40. The method of claim 36 wherein the conductive structure comprises one or more metals.

41. The method of claim 36 wherein the conductive structure comprises one or more of W, Ru and Mo.

42. The method of claim 36 wherein the first surfaces are above the second surfaces.

43. The method of claim 36 wherein the conductive structure is one of many conductive structures, wherein insulative structures comprise the insulative material; and wherein the template structure includes the insulative structures alternating with the conductive structures along a second direction which is substantially orthogonal to the first direction.

44. The method of claim 43 further comprising:

forming first masking structures over the semiconductor material, with the first masking structures being linear structures which extend along the first direction;

extending a pattern of the first masking structures into the semiconductor material to pattern the semiconductor material into linear features, with the linear features extending along the first direction and being over the first conductive structures;

forming second masking structures over the linear features, with the second masking structures extending along the second direction; and extending a pattern of the second masking structures into the linear features to pattern the linear features into the pillars.

45. The method of claim 43 wherein the insulative structures comprise one or both of silicon dioxide and silicon nitride.

46. The method of claim 43 wherein the insulative structures have about a same width along the second direction as the conductive structures.

47. The method of claim 43 wherein the insulative structures have a different width along the second direction than the conductive structures.

48. The method of claim 36 wherein the etching comprises reactive ion etching.

49. The method of claim 36 wherein the pillars are substantially four-sided in top-down view.

50. The method of claim 36 wherein the pillars comprise channel regions vertically between first and second source/drain regions, with the first source/drain regions being beneath the channel regions and electrically coupled to the first conductive structure, and with the second source/drain regions being above the channel regions; wherein the conductive structure is a first conductive structure; and further comprising:

forming second conductive structures proximate the channel regions; and forming storage elements coupled with the second source/drain regions.

51. The method of claim 50 wherein the first conductive structure is a digit line, and wherein the second conductive structures are wordlines.

52. The method of claim 51 wherein the pillars are active regions of access devices, wherein memory devices include the storage elements and the access devices; and wherein a memory array comprises the memory devices.

* * * * *